(12) United States Patent
Lasram et al.

(10) Patent No.: US 12,298,431 B1
(45) Date of Patent: May 13, 2025

(54) RADAR DATA MASKS IN AUTONOMOUS VEHICLE SIMULATIONS

(71) Applicant: Zoox, Inc., Foster City, CA (US)

(72) Inventors: Anas Lasram, South San Francisco, CA (US); James Graham Dolan, Sarasota, FL (US); Ximing Li, San Mateo, CA (US)

(73) Assignee: Zoox, Inc., Foster City, CA (US)

( * ) Notice: Subject to any disclaimer, the term of this patent is extended or adjusted under 35 U.S.C. 154(b) by 448 days.

(21) Appl. No.: 17/733,430

(22) Filed: Apr. 29, 2022

(51) Int. Cl.
| | |
|---|---|
| *G01S 7/40* | (2006.01) |
| *G01S 7/41* | (2006.01) |
| *G06F 30/20* | (2020.01) |
| *B60W 60/00* | (2020.01) |

(52) U.S. Cl.
CPC ............... *G01S 7/40* (2013.01); *G01S 7/406* (2021.05); *G01S 7/412* (2013.01); *G06F 30/20* (2020.01); *B60W 60/001* (2020.02); *B60W 2420/408* (2024.01)

(58) Field of Classification Search
CPC . G01S 7/40; G01S 7/406; G01S 7/412; G06F 30/20; B60W 60/001; B60W 2420/408
See application file for complete search history.

(56) References Cited

U.S. PATENT DOCUMENTS

| | | | | |
|---|---|---|---|---|
| 10,929,711 | B1 * | 2/2021 | Pfeiffer | .................. G06N 20/00 |
| 11,276,177 | B1 * | 3/2022 | Tsai | ........................ G06T 7/174 |
| 2019/0171912 | A1 | 6/2019 | Vallespi-Gonzalez | |
| 2020/0103523 | A1 * | 4/2020 | Liu | .......................... G01S 13/87 |
| 2020/0301799 | A1 * | 9/2020 | Manivasagam | ....... G01S 17/006 |
| 2021/0294346 | A1 | 9/2021 | Mao | |
| 2022/0284624 | A1 * | 9/2022 | Nimmagadda | ........... G06T 7/75 |
| 2023/0311930 | A1 | 10/2023 | Lasram | |
| 2023/0311932 | A1 | 10/2023 | Lasram | |

OTHER PUBLICATIONS

PCT Search Report and Written Opinion mailed Jul. 14, 2023 for PCT application No. PCT/US23/16755, 10 pages.

* cited by examiner

*Primary Examiner* — Peter M Bythrow
*Assistant Examiner* — Nazra Nur Waheed
(74) *Attorney, Agent, or Firm* — Lee & Hayes, P.C.

(57) ABSTRACT

A simulation system may generate radar data for synthetic simulations of autonomous vehicles by determining and applying radar masks for object radar data based on the attributes of simulated objects. A simulation system may determine a simulated object within a region of a simulated environment, and may apply a radar mask to determine the radar data within the region based on attributes of the simulated object. Such attributes may include the material properties, object type, and/or distance of the simulated object from the simulation sensors. Radar masks may be determining using masking percentages based on combinations of object attributes, and masks may be applied individually or by combining multiple masks for multiple occluding objects, in order to more accurately simulate the behavior of real-world radar signals in autonomous vehicle simulations.

17 Claims, 10 Drawing Sheets

Radar Mask Percentages

700

| Object Attribute | % Points Retained / Reflected |
|---|---|
| Object Type = Car | 95% |
| Object Type = Truck/Bus | 90% |
| Object Type = Bicycle | 70% |
| Object Type = Pedestrian | 55% |
| Object Type = Building | 75% |
| Object Type = Tree | 50% |
| Object Type = Traffic Sign | 95% |
| Material = Metallic | 100% |
| Material = Plastic | 60% |
| Material = Wood | 45% |
| Material = Glass | 70% |
| Material = Water | 40% |

Percentage Bias Factors

702

| Object Attribute | % Bias (Plus/Minus) |
|---|---|
| Direct Line of Sight | +5% |
| Range Within 10 m | +10% |
| Pedestrian Within Crosswalk | +10% |
| Object Within Road | +5% |
| Object Off Road/Sidewalk | -15% |

FIG. 7

RADAR DATA MASKS IN AUTONOMOUS VEHICLE SIMULATIONS

BACKGROUND

Simulated data and simulations can be used to test and validate features and functionalities of real-world systems, including features and functionalities that may be otherwise prohibitive to test in the real world (e.g., due to safety concerns, limitations on time, repeatability, cost, etc.). For example, autonomous vehicles and other moving vehicles may use driving simulations to test and improve passenger safety, vehicle decision-making, sensor data analysis, and route optimization. However, driving simulations that accurately reflect real-world scenarios may be difficult to create, as data used to create such simulations may be noisy, inconsistent, and/or incomplete. Additionally, driving simulations may involve multiple different systems and components interacting in a real-time simulated environment, which may be resource and computationally expensive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 7 depicts two example tables including radar data mask percentages and percentage bias factors associated with object attributes, in accordance with one or more examples of the disclosure.

DETAILED DESCRIPTION

Figure 1:
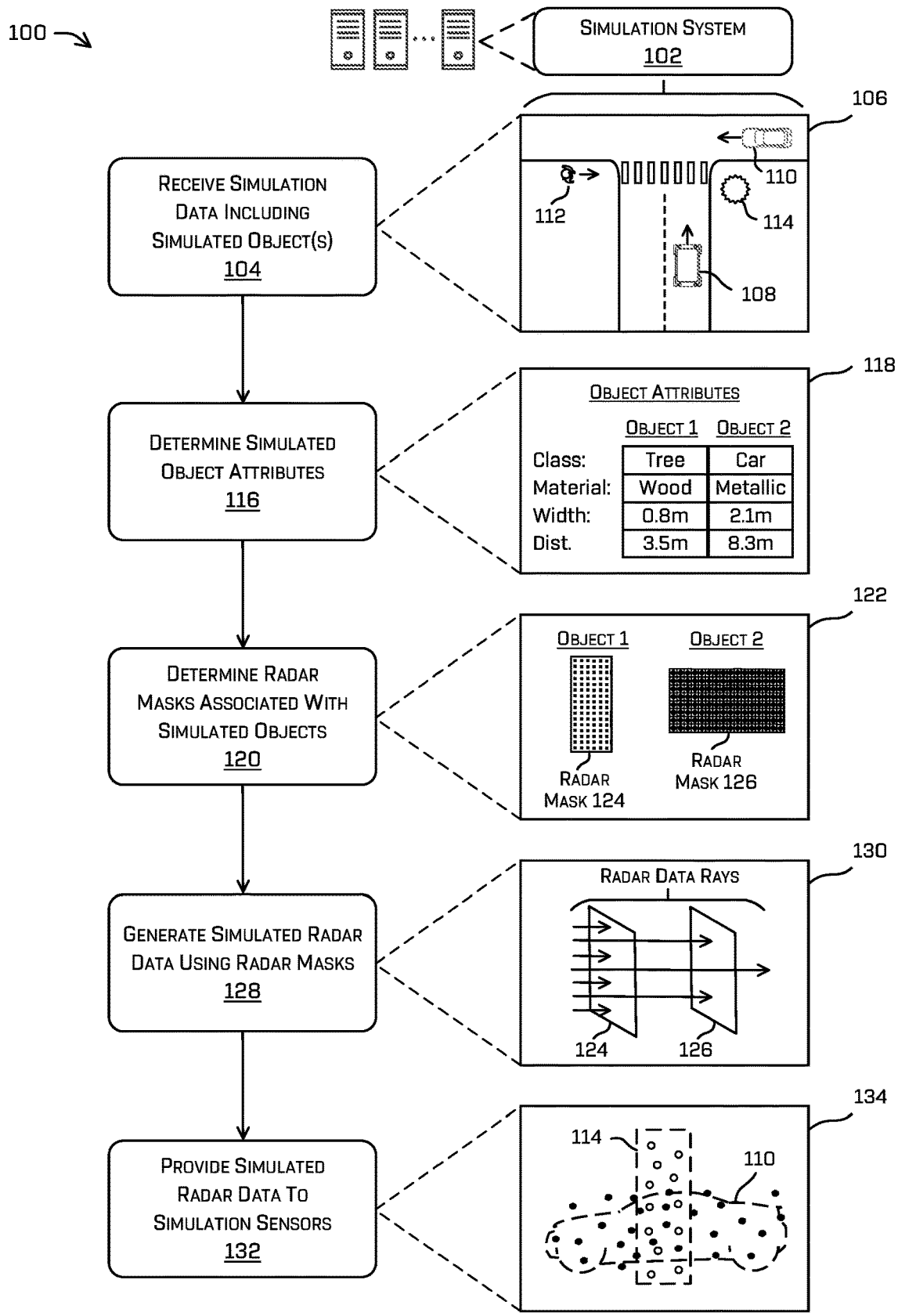
FIG. 1 depicts a technique for generating simulated radar data using radar masks based on simulated object attributes, in accordance with one or more examples of the disclosure.

This disclosure relates to techniques for generating radar data for use in simulations of real-world systems, such as autonomous vehicle simulations. In various examples described herein, a simulation system may be configured to generate radar data representing simulated objects in simulations. The simulation system may determine a region of a simulated environment in which to render a simulated object, and may generate radar data (and/or additional sensor data) within the region to simulate the presence of the object. To generate the radar data to represent the simulated object, the simulation system may determine and apply a radar mask based on the attributes of the simulated object. For example, simulated object attributes such as the material properties of the simulated object, the object classification, the distance and/or line of sight of the simulated object with respect to the radar sensors in the simulation, may be used by the simulation system to determine mask percentages to construct a radar mask associated with the simulated object. In some examples, radar masks can define percentages of radar data to retain or discard for a simulated object, or for particular regions/portions of the simulated object. This can result in a more realistic simulation that better emulates a radar system in simulation using techniques used for emulating visible light, for example. For instance, when using ray tracing operations to determine the simulated radar data for a simulated object, the simulation system may apply a radar mask to determine the percentage of rays simulating radar data points that may be permitted to pass through the simulated object. When a ray passes through a first simulated object, it may be reflected by another simulated object occluded by the first simulated object in the simulated environment. Occluded objects may include additional simulated objects in the simulation that are positioned behind the first simulated object from the perspective of the simulated autonomous vehicle with simulated radar sensors, so that the first simulated object partially or wholly blocks the occluded objects from direct (e.g., line of sight) detection by the simulated autonomous vehicle. As a result, when using ray tracing or other techniques, the simulated radar data generated for a bounding box or other simulation region associated with the first simulated object may include a combination of radar points reflected by the first simulated object, and additional radar points that may pass through the first simulated object and are reflected by additional objects behind the first simulated object.

Different simulated objects in a simulation may include different radar masks based on their respective attributes, such as material types, object classifications, distances and/or line of sight visibility from the simulated radar sensors, etc. Using ray tracing and/or other radar data simulation techniques, the simulated radar data may be generated based on the combination of radar masks associated with different simulated objects. As an example, a first radar mask for a simulated tree object may be configured to allow a relatively large percentage (e.g., 50%) of simulated radar points to pass through the simulated tree, while a second radar mask for a simulated vehicle object may be configured to allow a relatively small percentage (e.g., 20%) of simulated radar points to pass through the simulated vehicle. In this example, when the simulated vehicle is positioned behind the simulated tree in the simulated environment (e.g., from the perspective of simulated radar sensors), the simulated radar data generated for the region may be based on a combination of the radar masks. For instance, the percentage of radar points reflected by the simulated tree (e.g., 50%)

may be determined by the first radar mask, the percentage of radar points reflected by the simulated vehicle (e.g., 50%*80%=40%) may be determined by the first radar mask and the second radar mask, and the remaining percentage of radar points (e.g., 10%) may be potentially reflected by other simulated object(s) behind the simulated tree and the simulated vehicle. Because real-world radar signals may reflect or pass through different objects and different materials at different rates, the radar mask techniques described herein can more accurately simulate the behavior of real-world radar signals within the simulated environment.

As noted above, in some examples the techniques described herein may be used in conjunction with ray tracing and/or ray casting techniques that may be used to generate synthetic radar data for simulated objects in a simulated environment. For instance, GPU ray tracing operations may be performed to generate simulated radar data for a simulated object based on the position and orientation of the simulated object relative to the simulated radar sensors in the simulation (e.g., the radar sensors of a simulated autonomous vehicle). During GPU ray tracing, the simulation system may generate a number of simulated rays emitting in different directions from a simulated radar sensor. The simulation system may analyze the path of the simulated rays and determine intersection points along the ray path to generate the simulated radar point associated with each ray. The simulated radar points may be aggregated into a radar data set, such as a radar point cloud, and used during a simulation as a radar representation of a simulated object which may be rendered in one or more sensor data views to provide the sensor data to the simulated sensors. Various features and techniques for performing ray tracing and/or ray casting that may be used to generate radar data for simulated objects can be found, for instance, in U.S. patent application Ser. No. 17/321,205, filed May 14, 2021, and entitled "Sensor Simulation With Unified Multi-Sensor Views," the entire contents of which is incorporated by reference herein for all purposes.

It can also be understood from the context of this disclosure that the techniques for determining radar masks described herein can be used with techniques other than ray tracing for generating simulated radar data. For instance, the simulation system may use any number of techniques, alone or in combination, to determine an initial set of simulated radar data associated with a simulated object in a simulated environment. After determining the initial set of simulated radar data for the simulated object, the simulation system may apply the radar mask for the simulated object, and/or the radar masks for any other objects occluding the simulated object, to determine a modified radar data set for the simulated object. The modified radar data may include a reduced number of radar points from the initial data set, such as, for example, a diluted radar point cloud and/or any other subset of the radar data points representing the simulated object. Modified radar data sets for different simulated objects, such as overlapping or occluding objects, may be combined into the sensor data view provided as input to the simulation sensors.

A radar mask for a simulated object may be determined based on various attributes of the object, including but not limited to the material properties of the object, the object classification, the surface angles of the object relative to the radar sensor, the distance and/or line of sight visibility of the object from the simulated sensors, a geometry of an object, an existing model corresponding to the object, and/or the presence of occluding objects in the simulated environment. The simulation system may determine a radar mask for a simulated object based on a single object attribute (e.g., a material property) or based on a combination of object attributes (e.g., multiple material properties, an object pose, an object classification, an object range/distance, etc.). As an example, for a simulated object that is metallic and highly reflective of radar signals, the simulated system may determine a mask that retains most or all of the radar data for the object (e.g., reflects most of the rays simulating radar data points). In contrast, for a simulated object that is less reflective of radar signals, such as a tree, a pedestrian, or a glass or plastic object, the simulated system may determine a mask that discards a higher percentage of the radar data for the simulated object (e.g., allows more of the rays simulating radar data points to pass through the object).

Radar masks for different simulated objects also may be used in combination, for example, when a first simulated object occludes a second simulated object in the simulated environment. For example, the second simulated object may be partially or entirely blocked from being directly perceived by a simulated radar sensor in the simulation. As a result, the simulated radar data generated for the second simulated object may be affected by the attributes of the second simulated object, as well as the attributes of the first simulated object that is occluding the second simulated object from the simulated sensors. The simulation system may analyze the simulation scenario to identify which simulated objects are occluding other simulated objects, and may use the combination of radar masks for the simulated objects to determine percentages of the object radar data to retain (e.g., reflect) or discard (e.g., pass through) for each simulated object. Additionally, the simulation system can determine and apply radar masks to a simulated object as a whole, or to specific portions of the simulated object. For instance, different masks may be determined and applied to different portions of a simulated object, based on the different object portions having different material properties, different surface normal angles relative to the simulated radar sensors, etc.

As noted above, computer-based simulations such as driving simulations can be used to test and validate the responses of a simulated vehicle to a variety of different simulated scenarios for later use in the real world. For example, driving simulations may model normal or abnormal driving conditions and/or vehicle conditions, using a variety of simulated environments and simulated objects or agents. Driving simulations also may model various traffic conditions, environmental conditions, roadway obstructions, accidents, etc., to test and validate passenger safety, vehicle routing, decision-making, efficiency, etc. Certain driving simulations may test the responses of a simulated vehicle to defective and/or faulty sensors on the vehicle, and/or may be used to test individual components or systems of the simulated vehicle (e.g., a perception component, a decision-making or planning component, etc.). The same or different driving simulations may test the simulated vehicle as a whole including interactions between the various components or systems of the vehicle. Implementing thorough and robust simulation coverage can be important for vehicle safety and operational efficiency. Such simulation coverage may include scenarios that rarely occur in the real world, such as collisions with other objects, violations of traffic rules, etc., yet still require testing to validate safe operation, as well as provide a mechanism to consistently test control algorithms while varying certain factors and keeping other factors constant.

When generating driving simulations to perform testing and validation of an autonomous vehicle, a simulation system may instantiate any number of different simulated environments and/or driving scenarios to run within the simulated environments. Each instantiation of a simulated environment can be unique and defined, and enumerating all possible simulated environments and scenarios can require inordinate amounts of time and computing resources. However, unless every possible simulated environment is constructed, certain valuable driving scenarios may go untested. Thus, it can be valuable for simulation systems to generate as many simulated environments and scenarios as possible, in a timely and resource-efficient manner.

To generate driving simulations that cover a variety of simulated environments and driving scenarios, a simulation system may generate and run log-based simulations based on driving scenarios captured from vehicle log data and/or synthetic simulations based on synthetically generated driving environments and scenarios. For log-based driving simulations, the scenarios upon which driving simulations are generated may be based on driving log data captured in actual physical environments. For instance, the simulation system may generate simulations utilizing techniques such as those described in U.S. patent application Ser. No. 16/376,842, filed Apr. 5, 2019, and entitled "Simulating Autonomous Driving Using Map Data and Driving Data," U.S. patent application Ser. No. 16/555,988, filed Aug. 29, 2019, and entitled "Vehicle Controller Simulations," U.S. patent application Ser. No. 17/184,128, filed Feb. 24, 2021, and entitled "Agent Conversions in Driving Simulations," U.S. patent application Ser. No. 17/184,169, filed Feb. 24, 2021, and entitled "Simulating Agents based on Driving Log Data," the entire contents of which are incorporated herein by reference for all purposes.

In other examples, driving simulations may be synthetic simulations that are generated based on synthetic driving environments and/or scenarios. A synthetic driving scenario may be created, ab initio, programmatically, and need not be based on any driving log data associated with physical environments. In other instances, synthetic driving scenarios may be generated by adding, removing, and/or modifying various static or dynamic objects from a log-based driving scenario. To generate a synthetic environment and/or synthetic scenario on which to perform a driving simulation, the simulation system may determine and programmatically simulate the driving environment including the various static and/or dynamic objects (e.g., agents) within the simulated environment defined by the driving scenario. To programmatically generate and control the various simulated objects, the simulation system may use operational parameters to define the various attributes and/or behaviors of each simulated object. For instance, the operational parameters used to control a simulated object during a synthetic simulation may include parameters that define the starting location, pose, velocity, and/or acceleration of the simulated object at the beginning of the simulation. Additional operational parameters may include data values and/or settings used by simulated object controller(s) to determine navigation decisions and/or other behaviors for the simulated objects during the simulation. Based on the operational states, movements and/or other behaviors of the simulated objects at various time steps during a synthetic simulation, the simulation system may generate simulated sensor data to represent the simulated objects and the simulated environment as a whole. During the simulation, the simulated sensor data may be provided as input data to the simulated sensors of the simulated vehicle, allowing the simulation system to observe and validate the features and functionalities of the simulated vehicle.

Synthetic simulations, based on wholly or partially synthetic scenarios, may provide advantages over log-based simulations in some cases. For instance, log-based simulations may be based on real-world driving log data captured by the sensors of a vehicle traversing a physical environment, and as a result, the simulated environment and objects in log-based simulations may be constrained to appear and behave in the same manner as in the captured log data. Thus, log-based simulations may be limited as to the driving environments and scenarios that can be provided, and as to the features and functionalities that they can test and validate. Synthetic simulations, in contrast, can be programmed to simulate any possible driving scenario and to include any possible number and/or configuration of static and dynamic objects within a simulated environment. As a result, synthetic scenarios can provide more robust simulation testing and validation, by exposing the vehicle control systems in the simulation to many more possible combinations of simulated environments and configurations of simulated objects, object attributes, and/or object behaviors. For instance, log-based driving scenarios may be unable to represent particular configurations of simulated objects that have not been previously observed and captured as driving log data. However, synthetic simulations based on wholly or partially synthetic driving scenarios can readily include rarely (or never) observed environments and scenarios with particular object combinations or configurations, and/or object behaviors or attributes, by programmatically generating these uncommon simulated objects or other simulation features.

For these reasons, synthetic simulations may provide more complete and valuable test coverage of the vehicle control systems. However, generating and executing synthetic simulations may be more technically challenging than log-based simulations in some respects. For instance, generating synthetic multi-model sensor data (e.g., image data, lidar data, radar data, sonar data, etc.) to represent simulated objects within a simulation scenario can be technically difficult and computationally expensive. The simulated sensor data may be provided to simulated vehicle sensors during the simulation, and thus if the sensor data is inconsistent or unrealistic then the simulation may fail to adequately test the vehicle controllers. Sensor data such as radar data (e.g., radar data points and/or point clouds) may be particularly difficult to synthetically generate in a realistic manner that accurately represents real-world radar. In particular, it can be technically difficult and computationally expensive to generate synthetic radar data that accurately estimates the reflective properties of simulated environments including vehicles, pedestrians, trees, buildings, and other objects. When aberrant and unrealistic synthetically generated radar data is provided as input to a simulated vehicle during a simulation, the various functionality of the simulated vehicle controllers cannot be validated under real-world conditions. Some efforts to generate more realistic object radar data for use in simulations, including radar refraction computations, frequency shifts, etc., may require significant increases in computing power, which may reduce the overall number of simulations that a simulation system can generate and execute.

To address the challenges associated with generating and executing synthetic scenarios, various techniques described herein relate to determining and applying radar data masks (which also may be referred to as radar masks) to generate the radar data used to represent simulated objects within simulations. The radar data generated using radar masks can be provided to simulated sensors during simulations to more accurately simulate the behavior of real-world radar signals with respect to the simulated objects. Thus, these techniques improve the operation of the simulation system by generating and executing simulations with more realistic synthetic radar data. These techniques also improve the generation of the synthetic radar data for simulations using only minimal additional computing resources, for instance, by dithering and/or masking existing radar points rather than requiring recomputation or generation of additional radar points, or by implementing advanced algorithms. Further, in some cases, these techniques can improve the overall performance of the simulation system by reducing the number of radar data points needed for the sensor data views, and thus similarly reducing the number of graphics operations required to generate the radar data points.

These techniques also may improve the functioning, safety, and efficiency of autonomous and semi-autonomous vehicles. The techniques described herein may leverage the advantages of synthetic simulations, including more complete and robust simulation coverage, while also improving the quality of the simulations by generating synthetic radar data that more accurately simulates the behaviors of real-world radar signals. As a result of the more realistic and accurate synthetic radar data, the simulations described herein can more effectively test and validate the controllers and functionality of autonomous vehicles, including vehicle navigation systems, trajectory planning systems, safety systems, and the like.

FIG. 1 illustrates an example process 100 of generating synthetic radar data for a driving simulation, using radar masks based on the attributes of simulated objects in the simulation. In various examples, some or all operations of the example process 100 may be performed by computing devices configured as a simulation system 102. The simulation system 102 may be configured to perform various simulation functionality, including generating simulation scenarios and simulated objects, generating radar masks and simulated radar data, and executing driving simulations to validate the features and functionalities of the autonomous vehicle controllers. Process 100, and various other examples herein, are described in reference to driving simulations during which a simulated vehicle including one or more simulated sensors operates within a simulated environment. During a simulation, the simulation system 102 provides the simulated vehicle sensors (e.g., simulated radar sensors) with sensor input data representing the simulated environment and the simulated objects therein, and the simulated vehicle responds to the sensor input data by controlling the vehicle. However, it can be understood from the context of this disclosure that techniques described herein are not limited to driving simulation systems, and may be implemented in a similar or identical manner within other systems, including but not limited to video gaming systems, virtual reality systems, non-driving simulation systems (e.g., flight simulators, nautical navigation simulators, space navigation simulators, etc.), and/or image/sensor data processing systems operating in physical (e.g., non-simulated) environments.

Although process 100 and other examples herein are described in reference to generating and using simulated radar data, it can be understood from the context of this disclosure that similar or identical techniques can be implemented for different simulated sensor types and sensor data modalities. For instance, similar techniques to those described herein can be used to generate and/or modify synthetic lidar data by using data masks based on scenario and object attributes. Additionally or alternatively, similar techniques may be used to generate and/or modify synthetic video data, image data, audio data, sonar data, etc., using data masks based on scenario and object attributes, etc.

At operation 104, the simulation system 102 may receive simulation data associated with a synthetic simulation to be generated and executed. As described above, when generating a synthetic simulation the simulation system 102 may programmatically generate a simulated environment including a representation of a driving scenario for the simulation. The driving scenario may include a number of static and/or dynamic objects to be rendered within the synthetic simulation, and each simulated object may have a set of parameters defining the attributes and/or behaviors of the object. For example, at operation 104 the simulation system 102 may receive data identifying a number of simulated objects to be rendered during a synthetic simulation. For each simulated object, the data may include an object classification, position, size, pose, velocity, acceleration, material properties, and/or any other attribute. Box 106 depicts an example simulation scenario including a simulated autonomous vehicle 108 (or simulated vehicle 108) operating as a principal agent within the simulated environment. That is, the simulated vehicle 108 may be controlled by one or more vehicle controllers, the functionality and behavior of which are tested and validated within the simulation. The simulation scenario may be used to evaluate the behavior of the simulated vehicle 108 in response to the simulated environment and the additional simulated objects therein. As shown in this example, simulated car 110 may be a dynamic vehicle object, simulated pedestrian 112 may be a dynamic pedestrian object, and simulated tree 114 may be a static object. As described below, the synthetic simulation data received in operation 104 may include the attributes of the simulated vehicle 108 and/or any attributes associated with the simulated objects or the simulated environment. Additionally, for each simulated object in a synthetic simulation, the attributes may be associated with a particular time (or range of times) in the simulation. The example shown in box 106 may depict a top-down representation of a simulation scenario at a simulation starting time or any other particular point in time during a simulation. As the simulation progresses, some of the attributes may change for the simulated vehicle 108 and/or the simulated objects (e.g., position, pose, velocity, etc.) while other attributes for the simulated objects may be constant throughout the simulation (e.g., object classification, size, etc.).

At operation 116, the simulation system 102 may determine sets of attributes for any number of simulated objects in the simulation. For instance, the simulation system 102 may determine attributes for any or all of the simulated objects, based on the simulation data received in operation 104. In this example, box 118 includes a simplified set of attributes that may be determined for two objects in the simulation (e.g., simulated tree 114 and the simulated car 110), including an object type (e.g., tree, vehicle), an object material (e.g., wood, metallic), an object depth, and distance from the simulated sensors of the simulated vehicle 108. Although a simplified set of attributes is shown in this example, any number of different object attributes may be used in other examples. Object attributes may include any data associated with an individual simulated object, any other related/nearby objects in the simulated environment, and/or may include attributes associated with the simulated environment itself (e.g., map data features, driving conditions, region, weather conditions, etc.)

As described above, the simulation system 102 may select particular sets of object attributes that are more likely to affect the behavior of radar signals transmitted between the simulated vehicle 108 and the simulated object. In some examples, the object attributes determined by the simulation system 102 for the simulated car 110 may include attributes of the object itself, as well as attributes of any nearby objects and/or occluding objects that may affect the radar return signals from the simulated car 110. Examples of such attributes may include the object classification, position, pose, size, velocity, acceleration, color, and/or the material properties of the simulated car 110. Certain of these attributes, such as object position, pose, velocity and/or acceleration may be determined for the simulated car 110 relative to the simulated vehicle 108. Additionally, in some examples, the simulation system 102 may be configured to determine additional object attributes that may be used to weight and/or bias the percentages in the radar data masks determined for the simulated object. For instance, the simulated system 102 may bias/weight a radar data mask in favor of retaining additional radar data points for certain high-priority object types (e.g., pedestrians, bicycles, etc.), and/or may bias/weight a radar data mask in favor of retaining additional radar data points for objects that are close to the simulated vehicle (e.g., within a threshold distance), and/or those objects that have a direct line of sight (LOS) to the simulated vehicle 108. Thus, in such examples, the simulated system 102 may determine these additional attributes (e.g., object type, distance from the simulated vehicle and/or sensors), and may use these attributes in the heuristics to determine the radar mask for the simulated object, as described below.

In addition to determining a set of object attributes for a particular simulated object, the simulation system 102 also may determine additional attributes based on other simulated objects in the environment that may affect the radar return signals to/from the particular simulated object. For instance, in the example scenario shown in box 106, the simulated tree 114 is an occluding object that may block or redirect some portion of the radar signals transmitted to and from the simulated vehicle 108. Other objects that may affect the radar return signals that the simulated vehicle 108 receives from the simulated car 110 may include any objects near the simulated car 110 and/or in the background of the simulated car 110 (e.g., objects having a similar range, azimuth, and/or yaw with respect to the simulated vehicle 108). For any occluding objects in the simulation, and/or any other objects that may otherwise affect the radar return signals attributable to the simulated car 110, the simulation system may determine any of the same object attributes that may be determined for the simulated car 110 itself (e.g., object classification, relative position, relative pose, size, relative velocity, relative acceleration, color, and/or material properties).

At operation 120, the simulation system 102 may determine radar masks associated with one or more of the simulated objects in the simulation, based on the respective object attributes of the simulated objects determined in operation 116. As noted above, a radar mask for a particular simulated object can be based on a set of object attributes of the particular object itself, and/or additional attributes associated with other objects (e.g., nearby objects, occluding objects, etc.) or attributes associated with the simulated environment (e.g., weather conditions, lighting conditions/visibility, temperature, driving region, etc.). In some examples, a radar mask for a simulated object can define a portion (e.g., a percentage) of the simulated radar data for the object to retain or discard. For instance, when ray tracing/ray casting operations are used to generate simulated data radar, a radar mask associated with a simulated object may be configured to allow a portion of the rays intersecting the object to pass through the object, while causing the remaining rays intersecting the object to reflect back simulated radar data points. A radar mask for a simulated object may define the respective percentages of rays that are reflected back from the simulated object, and are allowed to pass through the simulated object so that they may be reflected back by another object behind the simulated object. In some cases, radar masks may be defined as two-dimensional masks corresponding to a bounding box determined for the simulated object, from the perspective of the simulated radar sensor. To allow the desired percentages of radar data to reflect/pass through a simulated object, the radar masks described herein may be implemented using any masking pattern (e.g., stipple patterns, dissolve patterns, etc.). Additionally or alternatively, radar masks may be defined in terms of probabilities that can be applied to individual radar points. For instance, a mask probability may be applied to a radar point (e.g., a ray intersection point) to determine whether the ray reflects off of or passes through the simulated object.

The percentages/probabilities of a radar mask may be based on the attributes of the simulated object associated with the radar mask. For example, a radar mask determined based on the material properties of a simulated object may retain most or all of the radar data for a metallic object and/or other highly-conductive materials, and may discard a greater portion of the radar data for simulated objects made of non-conductive materials such as plastic or glass, etc. The simulation system 102 also may determine the radar masks for simulated objects using the relative layout of the simulated objects in the simulation, including the positions, sizes, and/or angles of the simulated objects relative to the simulated radar sensors. For instance, when one simulated object (e.g., simulated tree 114) occludes another simulated object (e.g., simulated car 110) from the perspective of the simulated vehicle 108, the simulation system 102 may determine and apply radar masks to both simulated objects based on their respective attributes (e.g., classifications, sizes, positions, poses, and/or material properties), in order to simulate the phenomenon of radar data (e.g., rays) reflecting off of and/or passing through the sequence of simulated objects.

As noted above, radar masks determined by the simulation system 102 may define percentages and/or probabilities of the radar data associated with simulated objects to provide to the simulated radar sensors in the simulation. For instance, a 50% radar mask may cause approximately (or exactly) 50% of the radar points to be reflected off of a simulated car 110, a 90% radar mask may cause approximately (or exactly) 90% of the radar points to be reflected, etc. In some examples, a set of radar points may be predetermined for a simulated object (e.g., determined before applying the radar mask), and the percentages defined by the radar mask may correspond to a probability that the simulation system 102 may apply to individual radar points to determine if each radar point is retained or discarded. For instance, the simulation system 102 may use the percentage to cull the number of radar data points associated with the simulated car 110, and may select (e.g., randomly or based on a distribution) which radar points to discard from the predetermined set of radar data for the simulated object.

The simulation system 102 may determine different radar masks for simulated objects based on a single object attribute (e.g., material property/composition), or based on a combination of multiple object attributes. The attributes associated with an object can include any combination of attributes of the simulated object itself (e.g., material properties, classification, range, thickness, angle, pose, line of sight, etc.), the attributes of one or more other objects (e.g., material properties, size, thickness, pose, distance and angle relative to simulated vehicle 108 and/or other simulated object, occlusion percentage, etc.) such as occluding objects and/or objects near the simulated object. For instance, the simulation system 102 may determine a radar mask for the simulated car 110 based on the combination of the material properties of the simulated car 110, and the material properties of the simulated tree 114 occluding the simulated car 110. The simulation system 102 also may determine radar masks for the simulated objects based at least in part on the layout, type, and/or characteristics of the simulation scenario, such as the scenario type (e.g., highway scenario, 4-way stop scenario, crosswalk scenario, etc.), and/or various driving conditions of the simulation (e.g., weather conditions, lighting and temperature conditions, visibility conditions, etc.).

In various examples, the simulation system 102 may determine a radar data mask that is associated with a simulated car 110 in its entirety, or may determine different radar data masks that can be applied to different portions of a single simulated car 110. In this example, box 122 depicts an example showing two different radar masks having different patterns and/or levels of opacity, based on the respective object attributes of the associated simulated objects. Radar mask 124, which may correspond to the simulated tree 114, is less opaque indicating that it may allow a greater number of simulated radar rays to pass through the simulated object, and/or may retain less radar points associated with or reflected by the simulated object. Radar mask 126, in contrast, may correspond to the simulated car 110 (e.g., a simulated vehicle) is more opaque, indicating that it may allow a smaller number of simulated radar rays to pass through the simulated object, and/or may retain more radar points associated with or reflected by the simulated object. As shown in this example, the radar mask 124 and the radar mask 126 may apply to equal percentages/probabilities to the entirety of their respective object. In other examples, the simulation system 102 may determine that one or more object attributes associated with simulated car 110 or simulated tree 114 may apply to some portions of the simulated object and not to other portions. In such examples, the simulation system 102 may determine different portions of the object and/or different subregions of the radar mask having different levels of opacity/different mask percentages.

At operation 128, the simulation system 102 may generate radar data for the simulated objects in the simulation, using the radar masks determined in operation 120. The radar data for a simulated object can include a radar point cloud and/or any other set of associated radar points representative of the simulated object. In some examples, the simulation system 102 may use the layout and/or the geometry of a representation of the simulation. Such representations may include, for example, top-down representations, object flat-plane representations, and/or other 2D or 3D representations of the simulated environment. Such representations can include the locations, angles, sizes, poses, velocities, etc., for the simulated objects in the simulation, relative to the simulated vehicle/simulated sensors and/or other simulated objects. The radar data generated in operation 128 may include a synthetic set of radar points that may be detected by the radar sensors of the simulated vehicle 108 and are attributable to one or more simulated objects (e.g., simulated objects 110-114). Each radar point may include a number of data fields, such as range, yaw, azimuth, and/or velocity. In some examples, the simulation system 102 may determine a bounding box in a sensor data view that is associated with a simulated object, in which to generate radar data for the simulated object. In other examples, the simulation system 102 need not define bounding boxes to generate synthetic radar data for simulated objects and/or the simulated environment as a whole. For instance, the simulated radar data may be represented as a radar point cloud or any other arrangement of radar points attributable to a simulated object within a sensor data view.

To generate the radar data for a simulated object (e.g., any of simulated objects 110-114), the simulation system 102 may use a number of different techniques and/or combinations of techniques. In some examples, the simulation system 102 may use ray casting and/or ray tracing to generate synthetic radar data points corresponding to the simulated objects. For instance, the simulation system 102 may evaluate a representation of the simulation scenario (e.g., a top-down representation, 3D representation, graph-based representation, etc.) and may cast rays from the location of the radar sensor on the simulated vehicle 108, which may intersect simulated objects at various points in the simulated environment. The simulation system 102 may generate any number of simulated rays extending from the simulated vehicle 108 (or other location of a simulated radar sensor) out into different directions in the simulated environment. The number and the direction of simulated rays generated may be based on the resolution and/or field of view of the simulated radar sensor(s). When a ray intersects a simulated object, the simulation system 102 may determine a simulated radar point, including range data, azimuth data, yaw data, velocity data, RCS data, etc., based on the ray intersection point and the simulated object. Ray tracing operations may be used to generate radar point clouds that spatially align the simulated radar sensor and a 2D view of a simulated object. Various features and techniques for performing ray tracing and/or ray casting that may be used to generate radar data for simulated objects can be found, for instance, in U.S. patent application Ser. No. 17/321,205, filed May 14, 2021, and entitled "Sensor Simulation With Unified Multi-Sensor Views," the entire contents of which is incorporated by reference herein for all purposes.

When using ray tracing to generate synthetic radar data for the simulation, the simulation system 102 may use the radar masks generated in operation 120 to determine which simulated rays reflect off of and/or pass through various simulated objects. For instance, the example shown in box 130 depicts a number of simulated rays determined by the simulation system 102 for generating simulated radar data. The rays in this example may extend from the simulated vehicle 108 out toward various simulated objects 110-114 in the simulated environment. As noted above, the simulation system 102 may generate and project the rays depicted in box 130 based on the layout of objects in the simulated environment. The rays in this example may extend from the radar sensor of the simulated vehicle 108 onto a first radar mask 124 associated with the simulated tree 114. Based on the percentage values and/or opacity pattern of the first radar mask 124, a number of the simulated rays may be reflected back by the simulated tree 114. For any reflected rays, the simulation system 102 may generate radar points including synthetic radar data (e.g., range, yaw, azimuth, velocity, RCS, etc.) based on the intersection point between the simulated ray and the surface of the simulated tree 114. However, based on the percentage values and/or opacity pattern of the first radar mask 124, a number of other simulated rays may be permitted to pass through the first radar mask 124. These pass-through rays may encounter the second radar mask 126 associated with the simulated car 110 (e.g., the simulated vehicle behind the tree). Based on the percentage values and/or opacity pattern of the second radar mask 126, additional simulated rays may be reflected back by the simulated car 110. For any rays reflected back by the simulated car 110, the simulation system 102 may generate radar points including synthetic radar data (e.g., range, yaw, azimuth, velocity, RCS, etc.) based on the intersection point between the simulated ray and the surface of the simulated car 110. As shown in this example, one or more rays may pass through both the first radar mask 124 and the second radar mask 126. These rays may be reflected back by additional simulated objects and/or the background of the simulated environment. In other cases, the rays passing through both radar masks might not be reflected back by any object in the simulated environment, and thus the simulated radar data generated by the simulation system 102 might not include radar points corresponding to these pass-through rays.

Although certain examples described herein include using ray tracing to generate synthetic radar data for simulations, other techniques for generating radar data may be used additionally with or alternatively to ray casting and/or ray tracing. In some examples, the simulation system 102 may use the layout of the simulation to determine a region within a sensor data view (e.g., a bounding box or a bounding contour) associated with the simulated car 110. Such bounding boxes or other object regions may be determined within a top-view of the simulated environment, or within a flat-plane representation from the perspective of the simulated vehicle 108. The simulation system 102 then may determine a set of radar points to populate the object region (and/or an additional buffer region outside of the object region). To populate the region with a set of radar points representing the simulated car 110, the simulation system may use heuristics, a predetermined pattern or distribution of points, and/or may retrieve a previously stored set of radar data points associated with different object types, locations, poses, etc. For example, features and techniques for generating radar data for use in simulations based on real-world object radar data captured by sensors within physical environments, can be found, for instance, in U.S. patent application Ser. No. 17/710,596, filed Mar. 31, 2022, and entitled "Capturing And Simulating Radar Data For Autonomous Driving Systems," which is incorporated by reference herein in its entirety for all purposes.

Accordingly, when using certain techniques for generating simulated radar data, the simulated radar data for a simulated object may be generated prior to and/or independently of the radar mask for the simulated object. In such examples, the simulation system 102 may generate and/or receive an initial set of object radar data (e.g., a radar point cloud or other set of radar points) associated with a simulated object. The simulation system 102 may determine and apply the radar mask associated with the same simulated object to the initial set of object radar data. The resulting subset of the object radar data may be a modified set of the object radar data initially determined for the simulated object, and may be reduced from the initial radar data set by the approximate or exact percentage(s) of the radar mask. For instance, if the radar mask defines a radar data percentage of 30%, then the modified object radar data subset may include approximately 30% of the radar points from the object radar data. In such examples, the simulation system 102 may generate the simulated radar data for the object by applying retention percentages and/or probabilities of the radar mask to individual radar points, and/or by using the radar mask to cull or reduce the radar data randomly or in accordance with the opacity pattern or distribution of the radar mask. Although percentages are used as examples, it should be understood that similar techniques apply to distributions that may be applied as marks disclosed herein that may be non-uniform. The distributions may be organized and/or arranged based on geometric features of an object and/or a stored mode. For example, a tree may have a corresponding distribution wherein fewer emissions pass through a trunk and more pass-through branches/leaves. The distribution may be based the material and/or geometric properties of an object (e.g., a portion of the distribution that corresponds to more emissions being passed can correspond to a more transparent material or thinner material presented to the radar emission and vice-versa).

At operation 132, the simulation system 102 may provide the simulated radar data generated in operation 128 to one or more simulated sensors during the simulation. As discussed above, during a simulation the simulation system 102 may provide synthetic sensor data to the sensors of the simulated vehicle 108, to simulate the additional objects 110-114 in the simulated environment. In some examples, to provide the sensor data the simulation system 102 may generate one or more sensor data views, which may include 2D, 3D, and/or graph-based views representing the simulation environment from the perspective of the simulated vehicle 108. A sensor data view may include the simulated radar data generated by the simulation system 102 for one or more of the simulated objects in the environment (e.g., simulated objects 110-114). In some cases, the sensor data view may include multi-modal views in which different types or modalities of sensor data modality (e.g., lidar data, radar data, image data, etc.) are represented as different data channels within the same view. Box 134 depicts an example of simulated radar data that may be represented in a sensor data view. The simulated radar data shown in box 134 includes radar data points generated based on the associated with the simulated tree 114 and the simulated car 110, based on the radar mask associated with these simulated objects. As shown in this example, the simulated radar data associated with the simulated tree 114 includes a number of simulated radar points depicted as hollow circles representing radar points reflected by the simulated tree 114, and additional simulated radar points depicted as filled circles representing radar points that passed through the simulated tree 114 and were reflected by the simulated car 110.

Figure 2:
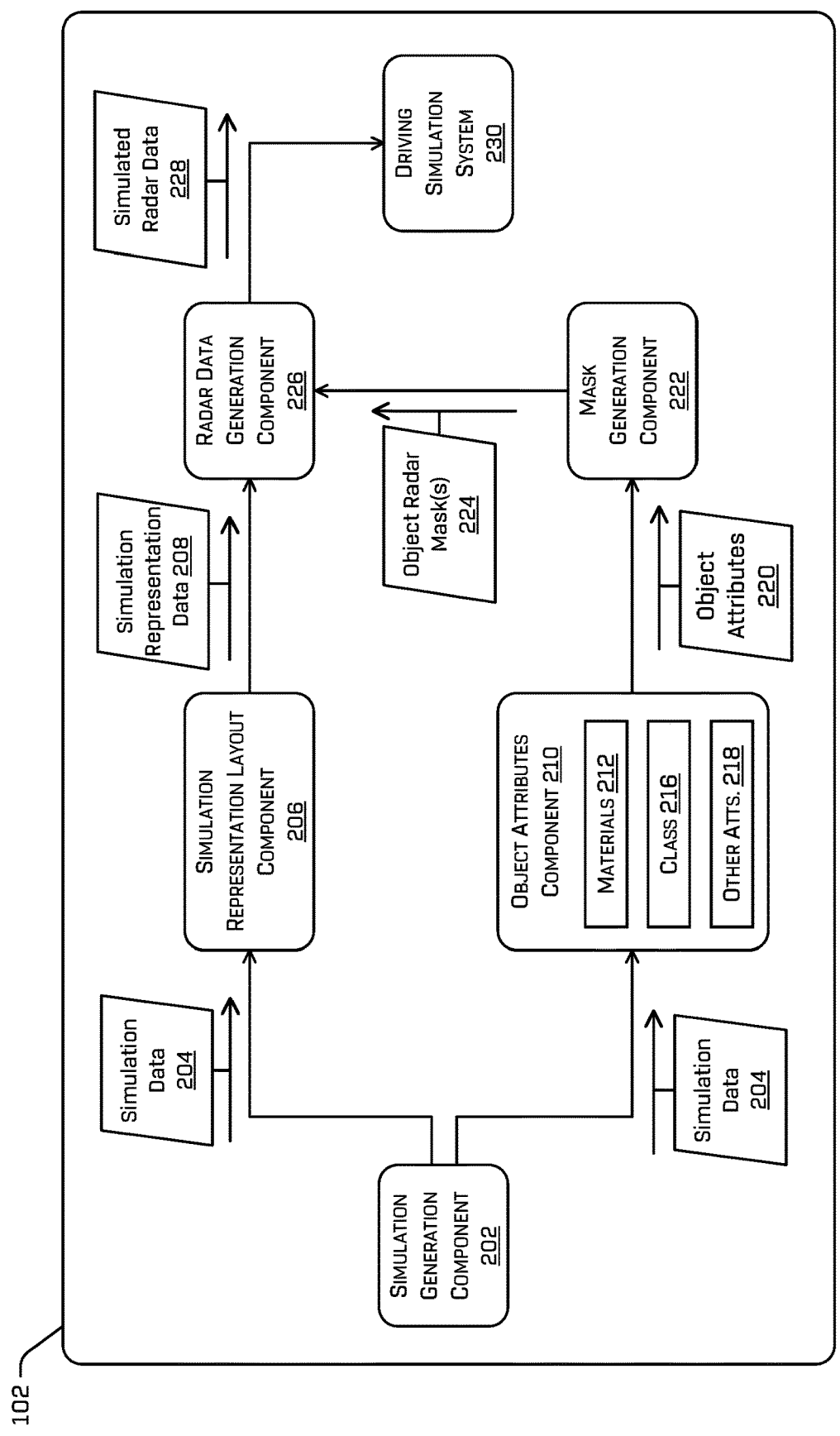
FIG. 2 depicts a system including components configured to generate simulation radar data using radar data masks based on object attributes, in accordance with one or more examples of the disclosure.

FIG. 2 is an example block diagram illustrating a number of subcomponents of an example simulation system 102. As discussed above, the simulation system 102 may be configured to receive data associated with a simulation to be generated, generate synthetic sensor data for use in the simulation, and execute the simulation. As in the above examples, the synthetic sensor data generated by the simulation system 102 may include radar data representing a number of simulated objects in the simulated environment. To generate the simulated radar data for the simulated objects, the simulation system 102 may determine radar masks based on the attributes of the objects, and use the radar masks to generate the simulated radar data associated with the objects. The simulation system 102 described in these examples may generate more realistic radar data representations of simulated objects in simulations, which may improve the efficacy of simulations as well as improving overall vehicle safety and efficiency of autonomous vehicles.

In this example, the simulation generation component 202 may receive and/or determine simulation data for a synthetic simulation to be generated and executed by the simulation system 102. The simulation data determined by the simulation generation component 202 may include data defining a number of simulated objects to be rendered within the simulation as well as object attributes associated with the simulated objects. For each simulated object that may be rendered during the simulation, the simulation data 204 may include the object classification, position, size, pose, velocity, material properties/composition, etc. The simulation data 204 also may include data defining the layout of the simulation scenario, including the type and characteristics of the scenario to be simulated (e.g., highway scenarios, 4-way stop scenarios, crosswalk scenarios, etc.) and the driving conditions to be simulated during the simulation (e.g., weather conditions, lighting and temperature conditions, visibility conditions, etc.).

Based on the simulation data 204 generated for the synthetic simulation, the simulation system 102 may provide some portions or all of the simulation data 204 to a simulation representation layout component 206 configured to generate and/or analyze the layout and relationships between the simulated objects to be rendered in the simulation. The simulation representation layout component 206 can use various techniques, including generating a top-down representation of the simulation scenario, and evaluating the geometry of the scenario including the positions and orientations of the various simulated objects. For example, the simulation representation layout component 206 may determine which simulated objects have a direct light of sight to the simulated radar sensors, and which simulated objects (or portions thereof) are occluded by other objects so that radar transmissions to/from the object may need to pass through other occluding objects in order to be detected by the radar sensors within the simulation. The simulation representation layout component 206 may generate simulation representation data 208, which may include one or more of a multi-channel top-down representation of the simulation environment, a flat-plane representation of the environment from the perspective of the simulated radar sensors, etc.

Additionally, the simulation system 102 may provide some portions or all of the simulation data 204 to an object attributes component 210 configured to determine a set of relevant attributes for the simulated objects within the simulation. Generally, the relevant attributes used by the object attributes component 210 for a simulated object may include the particular attributes that are likely to affect the behavior of radar signals transmitted to and/or from the object, such as object classification, material properties, size, surface normal angle, etc. In various examples, the object attributes component 210 may use heuristics to determine the set of relevant attributes associated with a simulated object, and thus the relevant attributes may change and/or may be weighted differently in different cases. As shown in this example, the object attributes component 210 may use subcomponents (e.g., functions or services) to determine sets of object attributes for individual simulated objects in the simulation. In this example, a materials subcomponent 212 may be configured to determine and provide the material properties for a simulated object. A class subcomponent 216 may be configured to determine and provide the object type and/or class for a simulated object, and one or more additional subcomponents 218 may be configured to determine and provide various other object attributes for simulated objects. For instance, an occlusions subcomponent may be used in some cases to determine and provide data relating to occlusions that partially or entirely block the simulated object from being perceived by the simulated sensors. Examples of occlusion data for a simulated object may include the number of occluding objects for the simulated object, the percentage of the simulated object occluded by each occluding object, the thickness, shape, and pose of each occluding object, the object types and/or materials of each occluding object, etc.

The object attributes component 210 may provide the object attributes data 220 associated within a simulated object, to a mask generation component 222. The object attributes data 220 for a particular simulated object may include the attributes of that object, as well as the attributes of other associated objects in the simulation, such as the attributes of any occluding objects and/or other nearby objects that may affect the radar return signals attributable to the simulated object. The mask generation component 222 may use various heuristics, described below in more detail, to determine radar mask(s) 224 associated with various simulated objects, based on the object attributes data 220.

As shown in this example, a radar data generation component 226 may be configured to receive simulation representation data 208 (e.g., a top-down representation of a simulation environment) and one or more radar mask(s) 224 associated with the simulated objects in the simulation environment. Using one or more of the various techniques described herein, the radar data generation component 226 may use the radar mask(s) 224 to generate simulated radar data 228 associated with the simulated objects. For instance, the radar data generation component 226 may use ray tracing techniques as described above, to generate synthetic radar data points. During the ray tracing, the radar data generation component 226 may use the simulation representation data 208 to determine intersection points between rays and the surfaces of various simulated objects. When a ray intersects with a simulated object, the radar data generation component 226 may apply the radar mask 224 associated with the simulated object to determine whether the ray may be reflected by or may pass through the simulated object. For reflected rays, simulated radar points may be generated based on the intersection point with the simulated object. In contrast, for any rays passing through the radar mask, simulated radar points may be generated by additional simulated objects occluded by the first simulated object, or might not be generated at all. As discussed above, the opacity and/or pattern of a radar mask 224 may determine which rays are permitted to pass through a simulated object and which rays are designated as reflecting rays. For instance, if a radar mask 224 for a simulated object includes a mask pattern with 30% opacity, then the simulated radar data 228 associated with the simulated object may include approximately 70% of the radar data points based on the object itself and the remaining 30% based on additional objects or a radar background, corresponding to pass-through rays.

The radar data generation component 226 may provide the simulated radar data 228 for any or all of the simulated objects in a simulation, to the driving simulation system 230. The driving simulation system 230 may be configured to execute the driving simulations generated by the simulation generation component 202, including using the simulated radar data generated by the components of the simulation system 102. During the execution of a simulation scenario, the driving simulation system 230 may instantiate a simulation environment and any number of simulated objects. As the simulation progresses, the driving simulation system 230 may provide simulated sensor data (e.g., the simulated radar data provided by the radar data generation component 226) to one or more sensors of the simulated autonomous vehicle executing within the driving simulation. The driving simulation system 230 also may be configured to monitor and evaluate the responses and behaviors of the simulated autonomous vehicle at different times in the simulation, and to validate the performance of various features and functionalities of the autonomous vehicle relative to a predetermined set of expected responses and behaviors.

Figure 3:
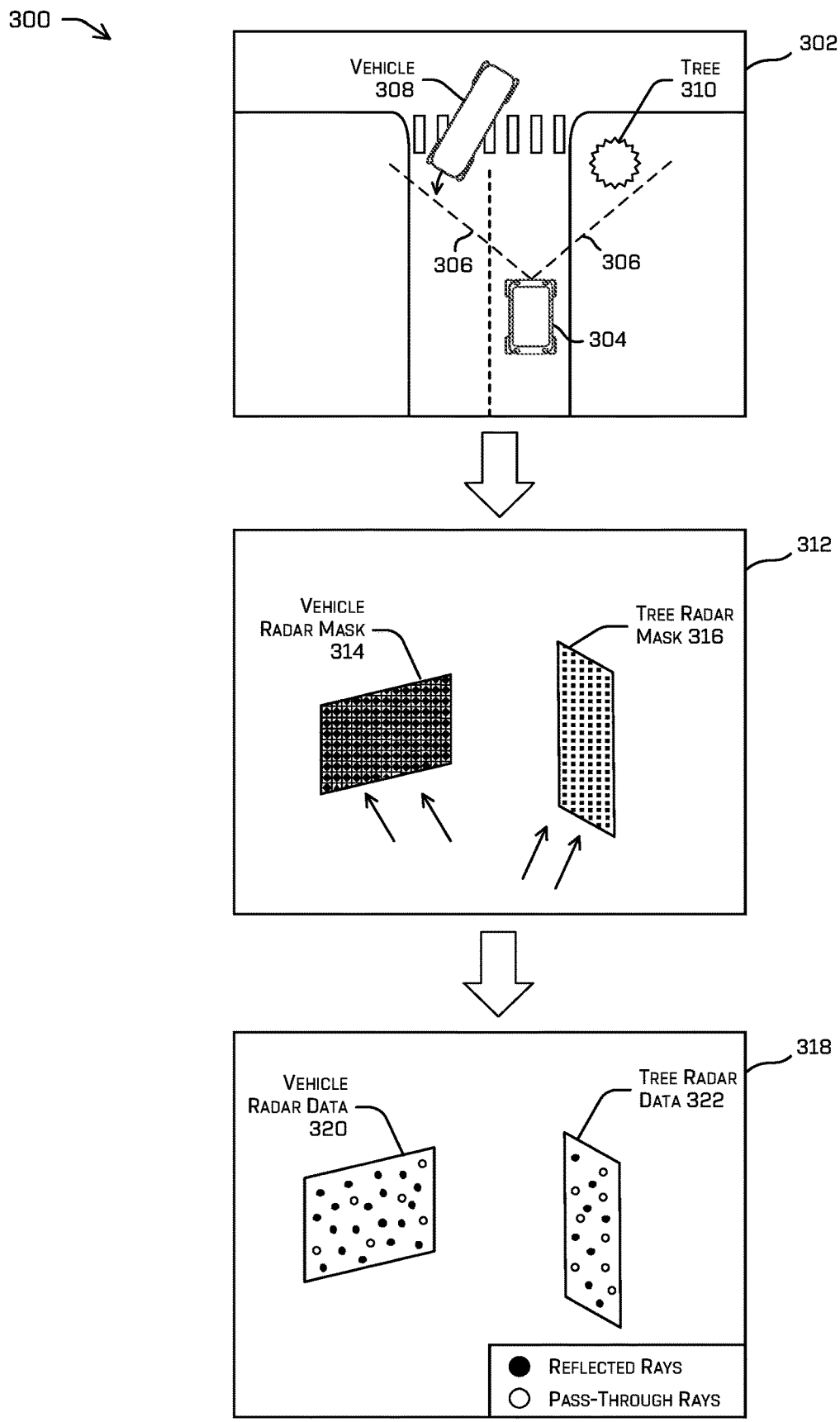
FIG. 3 illustrates a technique for determining radar data for simulated objects using radar masks based on object attributes, in accordance with one or more examples of the disclosure.

FIG. 3 depicts a diagram 300 illustrating an example technique for determining and applying radar masks based on the attributes of simulated objects within a simulated environment. In this example, box 302 depicts a top-down representation of a simulation scenario including a simulated vehicle 304. The simulated vehicle 304 may include any number of simulated sensors that, during the execution of the simulation, may be provided with simulated sensor data by the simulation system 102. As discussed above, in some examples, the simulation system 102 may construct sensor data views based on the position and orientation of the sensors of the simulated vehicle 304. Simulated radar data (and/or other multi-modal sensor data) can be rendered on the sensor data views, and provided to the sensors of the simulated vehicle 304 during the execution of the simulation.

In this example, lines 306 may represent the field of view of a radar sensor of the simulated vehicle 304. Based on the field of view of the radar sensor, the simulated vehicle 304 may detect additional objects in the simulated environment, including at least a vehicle 308 and a tree 310. Box 312 depicts two different radar masks corresponding to the simulated objects depicted in box 302. The vehicle radar mask 314 corresponds to the vehicle 308, including a size and shape based on the bounding box of the vehicle 308 from the perspective of the radar sensors of the simulated vehicle 304, and with a pattern and opacity based on the attributes of the vehicle 308. The tree radar mask 316 corresponds to the tree 310, including a size and shape based on the bounding box of the tree 310 from the perspective of the radar sensors of the simulated vehicle 304, and with a pattern and opacity based on the attributes of the tree 310. As described above, the radar masks may be based on the attributes of their respective objects. For instance, the vehicle radar mask 314 applied to the vehicle 308 may be based on the attributes of the vehicle 308, including the material properties (e.g., metallic), the object type/subtype (e.g., vehicle/bus), and/or the pose (e.g., surface normal angles relative to the simulated radar sensors). In contrast, the tree radar mask 316 applied to the tree 310 may be based on the attributes of the tree 310, including the material properties (e.g., wood), the object type/subtype (e.g., static/tree), and/or the thickness and number of the trees.

Box 318 depicts simulated vehicle radar data 320 representing the vehicle 308, and simulated tree radar data 322 representing the tree 310. As discussed above, the simulation system 102 may use various techniques to generate the simulated radar data. In the example shown in box 318, the simulation system 102 may perform ray casting operations in which the vehicle radar mask 314 and tree radar mask 316 are used to determine which rays are reflected by and which rays pass through the respective objects. As shown in this example, filled circles represent radar points generated based on rays reflected by the respective simulated objects, and hollow circles represent radar points based on rays that passed through the respective simulated objects. As noted above, the pass-through rays may be reflected by different objects behind the respective simulated objects, or might not be reflected back to the radar sensors of the simulated vehicle 304 at all. Additionally, although this example depicts using ray casting to generate the radar, in other examples the vehicle radar mask 314 and tree radar mask 316 can be used with other radar data generation techniques. For instance, the vehicle radar mask 314 and the tree radar mask 316 can be applied to predetermined initial radar data/point clouds associated with the simulated objects, to reduce or cull the radar data associated with the simulated objects.

As described above, the opacity levels and patterns associated with the radar masks may be determined based on heuristics and/or trained models to accurately simulate the behaviors of real-world radar signals transmitted from the simulated vehicle 304 toward the simulated objects. In this example, based on a set of heuristics and/or trained models, the metallic surface of the vehicle 308 may cause the mask used to determine the vehicle radar mask 314 to reflect (or otherwise retain) a greater percentage of the radar data (e.g., 90%) from the vehicle 308, while the wood composition of the tree 310 may cause the tree radar mask 316 to reflect (or retain) a lesser percentage of the radar data (e.g., 50%) from the tree 310.

Figure 4:
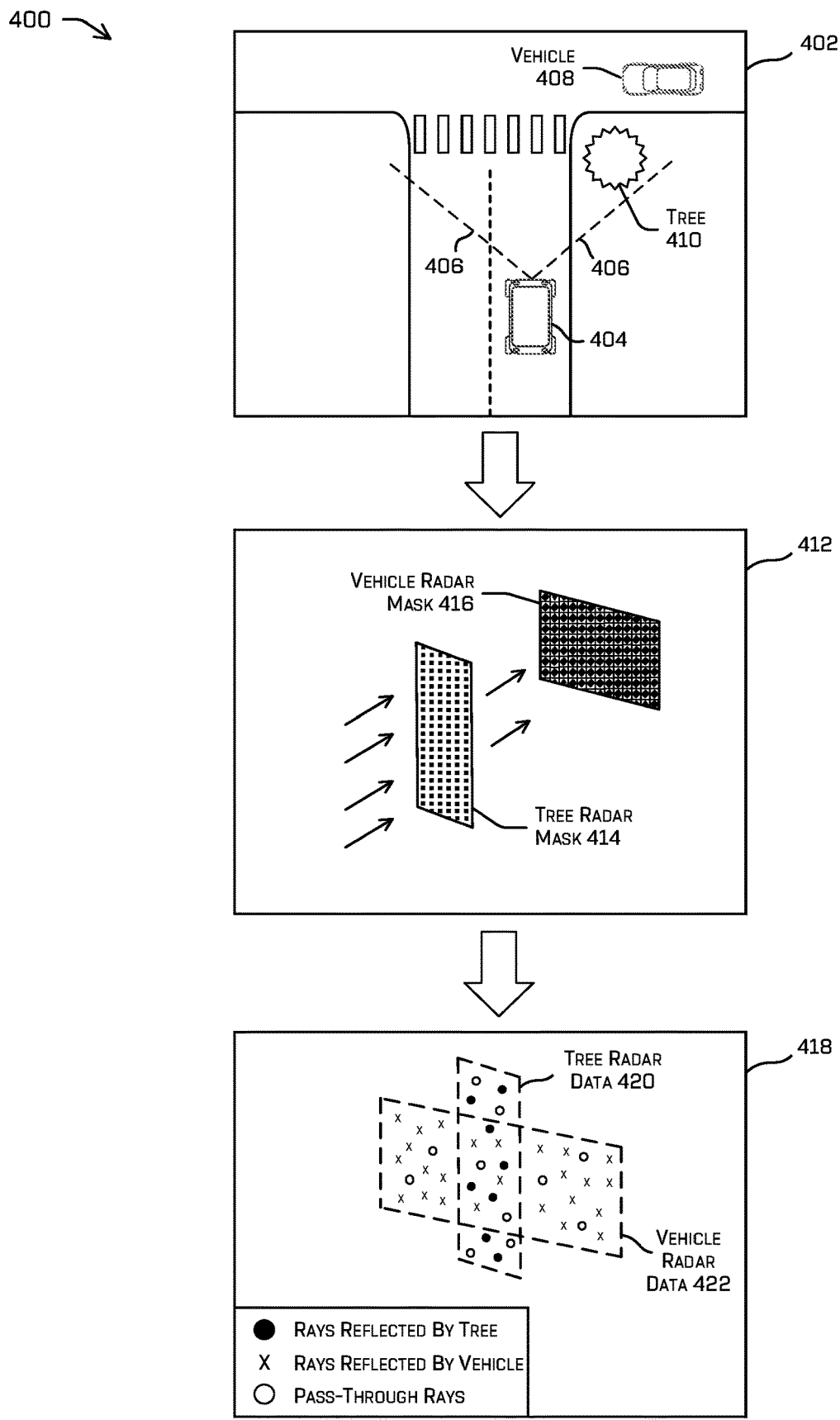
FIG. 4 illustrates another technique for determining radar data for simulated objects using radar masks based on object attributes and simulation layouts, in accordance with one or more examples of the disclosure.

FIG. 4 depicts another diagram 400 illustrating an example technique for determining and applying radar masks based on the attributes of simulated objects within a simulated environment. In this example, box 402 depicts a top-down representation of a similar simulation scenario to the scenario described above in box 302. In this example, a simulated vehicle 404 includes a number of simulated sensors, including a simulated radar sensor having a field of view defined by lines 406. The simulated vehicle 404 may use the radar sensor to detect objects in the simulated environment, including a vehicle 408 and a tree 410 that is partially occluding the vehicle 408 from the radar sensors of the simulated vehicle 404.

Box 412 depicts two different radar masks corresponding to the simulated objects depicted in box 402. The tree radar mask 414 corresponds to the tree 410 and the vehicle radar mask 416 corresponds to the vehicle 408. As described above, the radar masks may be based on the attributes of their respective objects. In this example, the tree radar mask 414 is less opaque and allows more radar data to pass through, whereas the vehicle radar mask 416 is more opaque and allows less radar data to pass through. Based on the relative positions of the vehicle 408 and the tree 410 within the simulation, box 412 shows that rays originating at the vehicle 404 may first intersect the tree radar mask 414, and any rays that pass through the tree radar mask 414 may then intersect the vehicle radar mask 416.

Box 418 depicts simulated tree radar data 420 representing the tree 410, and simulated vehicle radar data 422 representing the vehicle 408. As discussed above, the simulation system 102 may use various techniques to generate the simulated radar data. In the example shown in box 418, the simulation system 102 may perform ray casting operations in which the tree radar mask 414 and vehicle radar mask 416 are used to determine which rays are reflected by and which rays pass through the respective objects. As shown in this example, filled circles represent radar points generated based on rays reflected by the tree 410, X's represent radar points generated based on rays reflected by the vehicle 408, and hollow circles represent radar points based on rays that passed through the tree 410 and/or the vehicle 408.

In this example, the tree radar mask 414 may be based on the attributes of the tree 410, including the material properties (e.g., wood) and size of the tree 410, etc. The vehicle radar mask 416 may be based on the attributes of the vehicle 408, including the material properties (e.g., metallic), the object type (e.g., vehicle/car), and/or the pose (e.g., surface normal angles relative to the simulated radar sensors), etc. In this example, based on a set of heuristics and/or trained models and the combination of relevant object attributes for the vehicle 408 and tree 410, the simulation system 102 may determine the number (e.g., percentages and/or probabilities) of radar data points being reflected by each of the simulated objects and/or passing through one or both of the objects. For instance, if a first percentage of radar data (e.g., 50%) passes through the tree radar mask 414 and a second percentage of radar data (e.g., 10%) passes through the vehicle radar mask 416, then a third smaller percentage of the overall radar data (e.g., 5%) may pass through both the tree radar mask 414 and the vehicle radar mask 416.

Figure 5:
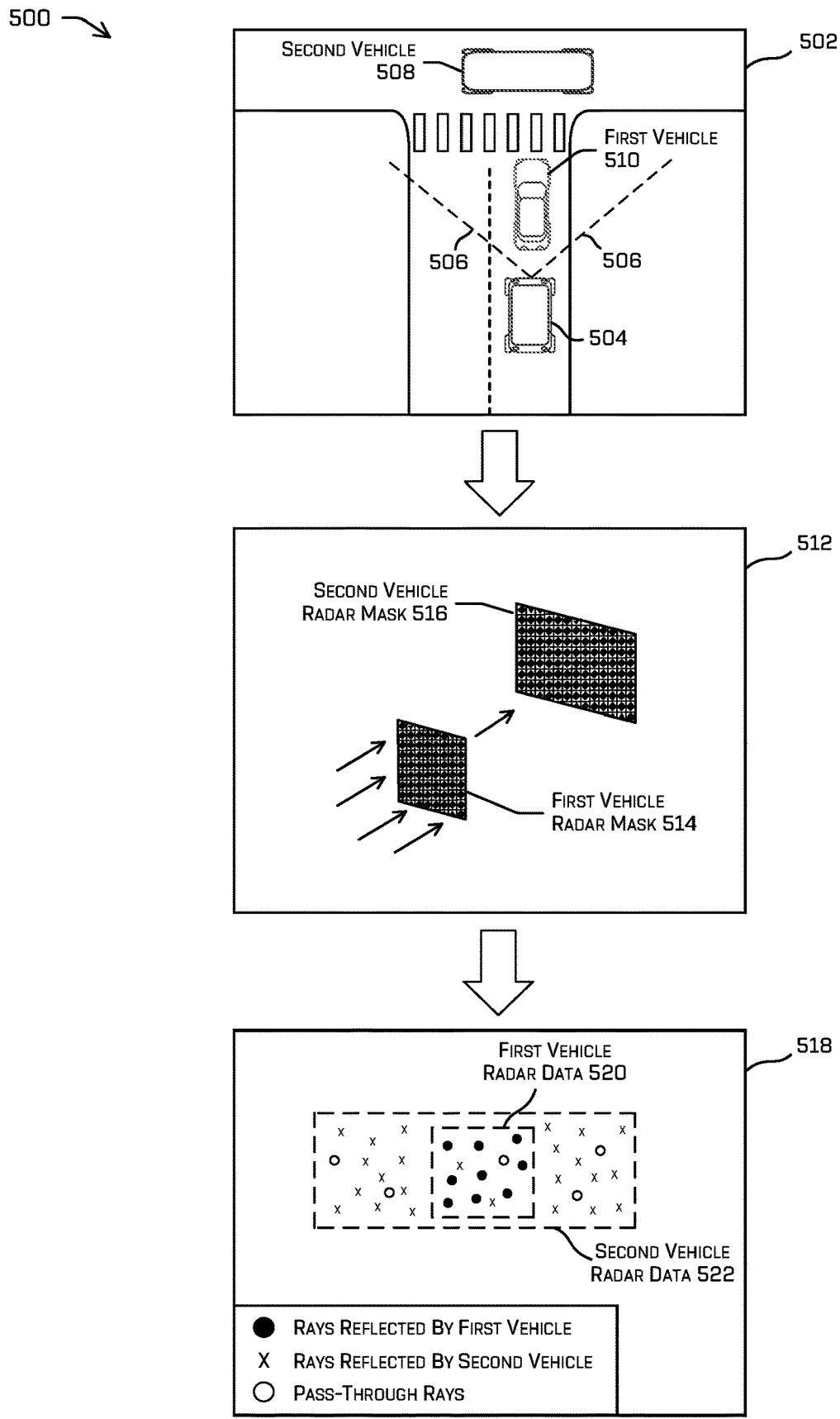
FIG. 5 illustrates another technique for determining radar data for simulated objects using radar masks based on object attributes and simulation layouts, in accordance with one or more examples of the disclosure.

FIG. 5 depicts another diagram 500 illustrating an example technique for determining and applying radar masks based on the attributes of simulated objects within a simulated environment. Box 502 depicts a top-down representation of a similar simulation scenario to the scenario described above in box 402. In this example, a simulated vehicle 504 includes a number of simulated sensors, including a simulated radar sensor having a field of view defined by lines 506. The simulated vehicle 504 may use the radar sensor to detect objects in the simulated environment, including a second vehicle 508 (e.g., a truck or bus) that is currently occluded by a first vehicle 510 (e.g., a car).

Box 512 depicts two different radar masks corresponding to the simulated objects depicted in box 502. The first vehicle radar mask 514 corresponds to the first vehicle 510 and the second vehicle radar mask 516 corresponds to the second vehicle 508. As described above, the radar masks may be based on the attributes of their respective objects. In this example, both the first vehicle radar mask 516 and the second vehicle radar mask 516 may have relatively high levels of opacity that may allow less radar data to pass through. Additionally, based on the relative positions of the first vehicle 510 and the second vehicle 508 within the simulation, box 512 shows that rays originating at the simulated vehicle 504 may intersect the first vehicle radar mask 514, and then any rays that pass through the first vehicle radar mask 514 may intersect the second vehicle radar mask 516.

Box 518 depicts simulated radar data for the first vehicle 510 and the second vehicle 508 within the simulation. As discussed above, the simulation system 102 may use various techniques to generate the simulated radar data. In the example shown in box 518, the simulation system 102 may perform ray casting operations in which the first vehicle radar mask 514 and second vehicle radar mask 516 are used individually and/or in combination to determine which rays are reflected by and which rays pass through the respective objects. As shown in this example, filled circles represent radar points generated based on rays reflected by the first vehicle 510, X's represent radar points generated based on rays reflected by the second vehicle 508, and hollow circles represent radar points based on rays that passed through the first vehicle 510 and/or the second vehicle 508. In this example, based on a set of heuristics and/or trained models and the combination of relevant object attributes for the first vehicle 510 and second vehicle 508, the simulation system 102 may determine the number (e.g., percentages and/or probabilities) of radar data points being reflected by each of the simulated objects and/or passing through one or both of the objects. For instance, if a first percentage of radar data (e.g., 20%) passes through the first vehicle radar mask 514 and a second percentage of radar data (e.g., 10%) passes through the second vehicle radar mask 516, then a third smaller percentage of the overall radar data (e.g., 2%) may pass through both the first vehicle radar mask 514 and the second vehicle radar mask 516.

Figure 6:
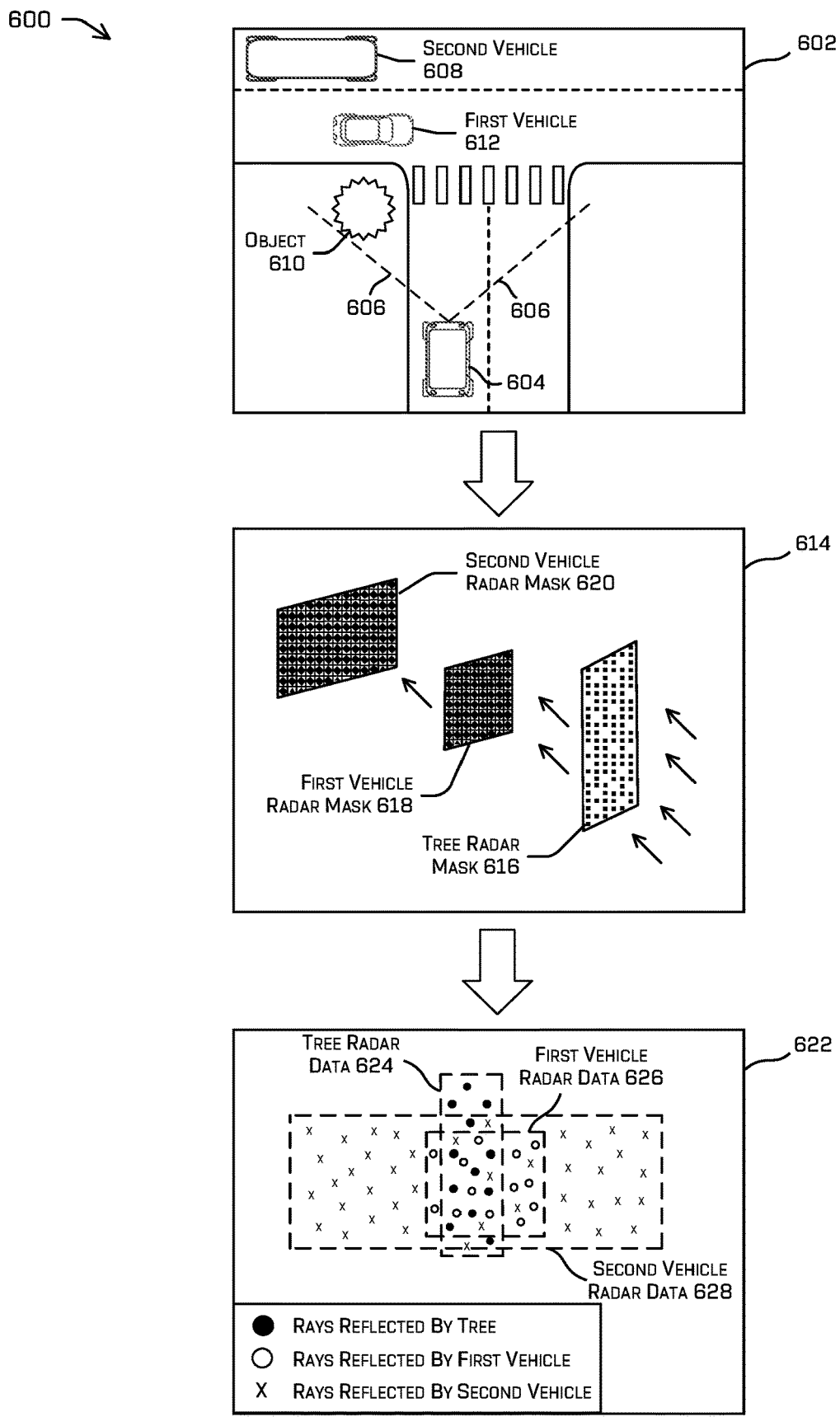
FIG. 6 illustrates another technique for determining radar data for simulated objects using radar masks based on object attributes and simulation layouts, in accordance with one or more examples of the disclosure.

FIG. 6 depicts another diagram 600 illustrating an example technique for determining and applying radar masks based on the attributes of simulated objects within a simulated environment. In this example, box 602 depicts a top-down representation of a similar simulation scenario to the scenario described above in box 502. In this example, a simulated vehicle 604 includes a number of simulated sensors, including a simulated radar sensor having a field of view defined by lines 606. The simulated vehicle 604 may use the radar sensor to detect objects in the simulated environment, including a second vehicle 608 (e.g., a truck or bus) that is currently occluded by two other objects: a tree 610 and a first vehicle 612 (e.g., a car).

Box 614 depicts three different radar masks corresponding to the simulated objects depicted in box 602. The tree radar mask 616 corresponds to the tree 610, the first vehicle radar mask 618 corresponds to the first vehicle 612, and the second vehicle radar mask 620 corresponds to the second vehicle 608. As described above, the radar masks may be based on the attributes of their respective objects. In this example, the tree radar mask 616 has a relatively low level of opacity that may allow more radar data to pass through, and both the first vehicle radar mask 618 and the second vehicle radar mask 620 have relatively high levels of opacity that allow less radar data to pass through. Based on the relative positions of the tree 610, the first vehicle 612, and the second vehicle 608 within the simulation, box 614 shows that rays originating at the simulated vehicle 604 may intersect the tree radar mask 616, after which rays that pass through the tree radar mask 616 may intersect the first vehicle radar mask 618, after which rays that pass through the first vehicle radar mask 618 may intersect the second vehicle radar mask 620.

Box 622 depicts simulated radar data associated with the tree 610, the first vehicle 612, and the second vehicle 608 within the simulation. As discussed above, the simulation system 102 may use various techniques to generate the simulated radar data. In the example shown in box 622, the simulation system 102 may perform ray casting operations in which the tree radar mask 616, the first vehicle radar mask 618, and the second vehicle radar mask 620 are used individually and/or in combination to determine which rays are reflected by and which rays pass through the respective objects. As shown in this example, filled circles represent radar points generated based on rays reflected by the tree 610, hollow circles represent radar points based on rays reflected by the first vehicle 612, and X's represent radar points generated based on rays reflected by the second vehicle 608.

FIG. 7 illustrates example heuristics that may be used by the simulation system 102 to determine percentages (e.g., opacity percentage, radar point retention percentages, etc.) for radar masks associated with a simulation object, based on the attributes of the object. As described above, radar masks may define percentages of radar data that may be reflected by a simulated object, based on the presence or absence of various attributes of the object. In this example, two example tables are shown including possible attributes associated with a simulated object, and corresponding percentages of radar data to reflect and/or retain. Table 700 includes a listing of attributes that may apply to a simulated object, such as various object types and materials, along with corresponding radar data percentages to be applied to objects with matching types and/or materials. Table 702 includes a listing of additional attributes that may be applied as biasing factors to the radar mask percentages determined using table 700.

As discussed above, when the simulation system 102 identifies multiple attributes for a simulated object, it may determine a radar data mask by combining the corresponding retention percentages for the attributes. Using table 700 and table 702 as an example, for a simulated pedestrian occluded by a tree, the simulation system 102 may calculate the amount of radar data points reflected by the pedestrian based on the percentage associated with a simulated pedestrian (e.g., 55%) and the percentage associated with an occluding tree (e.g., 50%). In this example, if the pedestrian is within 10 meters of the simulated radar sensor, the simulation system 102 may bias the calculated percentage to reflect and/or retain 10% more of the radar points reflected by the pedestrian. In various examples, two or more percentages may be multiplied or otherwise combined to determine the retention percentage for the radar data mask of the associated object.

Additionally, it can be understood from the context of this disclosure that the table 700 and 702 are illustrative only, and that in other examples the simulation system 102 may use any combination of heuristics, logical algorithms, and/or trained machine learning (ML) models to determine masking percentages for radar data masks based on associated object attributes. For instance, ML models may be trained based on ground truth radar signal data retrieved from vehicle logs captured by autonomous vehicles traversing real-world driving environments. Additional techniques and features relating to capturing and using sensor data from vehicle logs to train ML models can be found, for instance, in U.S. patent application Ser. No. 17/710,596, filed Mar. 31, 2022, and entitled "Capturing And Simulating Radar Data For Autonomous Driving Systems," which is incorporated by reference herein in its entirety for all purposes.

Figure 8:
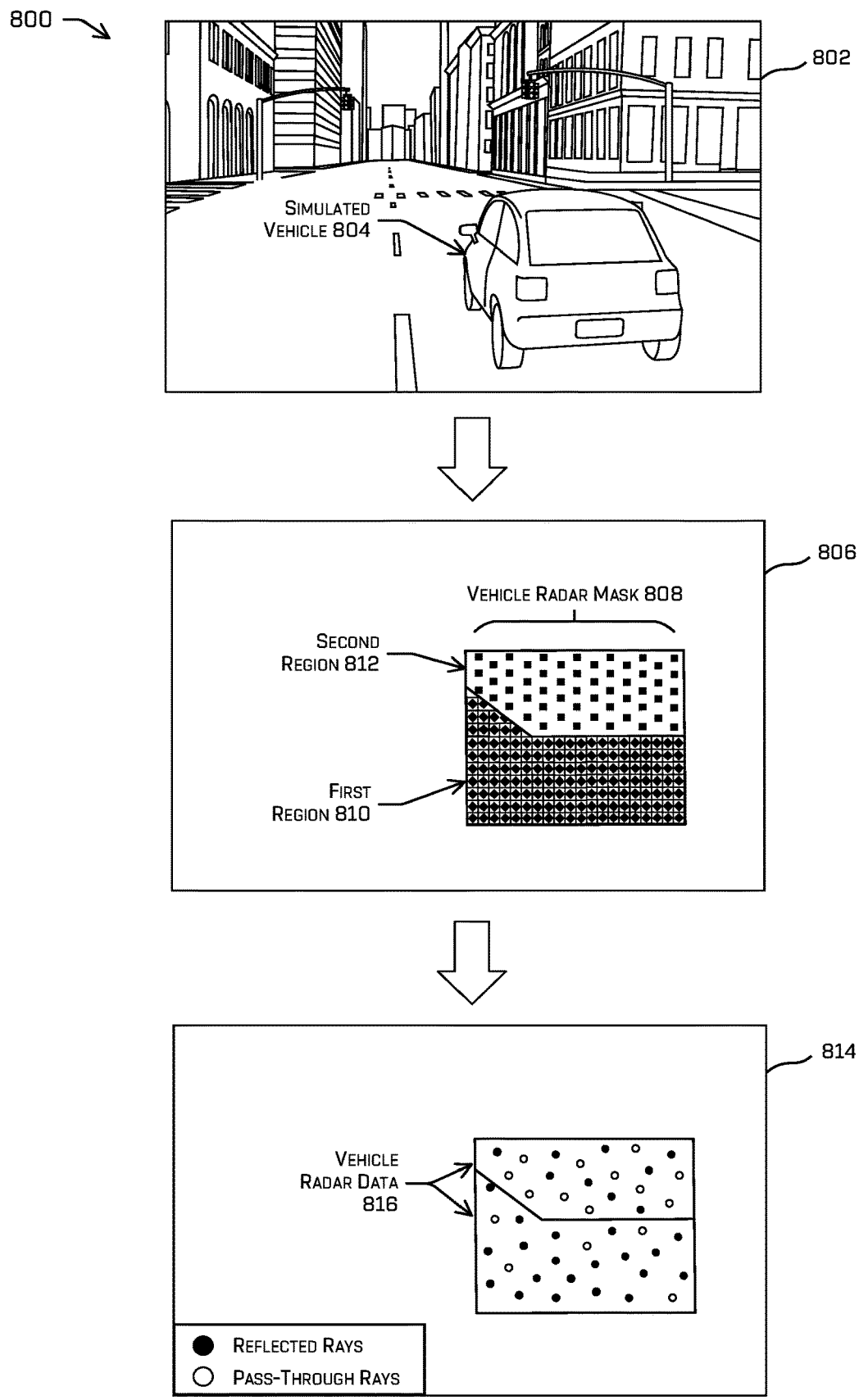
FIG. 8 illustrates another technique for determining radar data for simulated objects using radar masks based on object attributes and simulation layouts, in accordance with one or more examples of the disclosure.

FIG. 8 depicts another diagram 800 illustrating an example technique for determining and applying radar masks based on the attributes of simulated objects within a simulated environment. In this example, box 802 depicts a view representation of a simulation scenario from the perspective of a simulated vehicle (not shown). As in the above examples, the simulated vehicle in this example may include any number of simulated sensors, including a simulated radar sensor having a field of view projecting in front of the vehicle. The simulated vehicle may use the radar sensor to detect objects in the simulated environment, including a simulated vehicle 804 that is positioned in front of a simulated radar sensor in the simulation.

As discussed above, the simulation system 102 may determine radar masks that can be applied to a simulated object in its entirety, and/or may determine radar masks including subregions that apply different radar percentages to different portions of the simulated object. For instance, when the simulation system 102 determines that an object attribute (e.g., a material property, etc.) applies to one portion of a simulated vehicle 804 but not to other portions, the simulation system 102 may generate a radar mask having different regions that use different opacity levels and/or patterns. For instance, the simulation system 102 may compute different percentages for the different regions of a radar mask based on the different sets of attributes associated with each region. As an example, if the lower portion of the simulated vehicle 804 consists primarily of one material (e.g., metal) and the upper portion of the simulated vehicle 804 consists primarily of a different material (e.g., glass, plastic, and/or canvas), then the simulation system 102 may determine a mask for the simulated vehicle in which a greater percentage of the radar data is retained for the lower metallic region of the vehicle, and a lesser percentage of the radar data is retained for the upper non-metallic region. In other examples, if one side of a simulated object is occluded by another object but the other side is not occluded, the simulation system 102 may determine a multi-region mask for the simulated object in which a greater percentage of the radar data is retained for the non-occluded side of the simulated object, and a lesser percentage of the radar data is retained for the occluded side.

Box 806 illustrates an example of a vehicle radar mask 808 generated by the simulation system 102 based on the attributes of the simulated vehicle 804. As shown in this example, the vehicle radar mask 808 is a multi-region radar mask that includes a first region 810 having a higher radar reflection percentage (e.g., corresponding to the metallic surfaces of the simulated vehicle 804), and a second region 812 having a lower radar reflection percentage (e.g., corresponding to the non-metallic surfaces of the simulated vehicle 804).

Box 814 depicts simulated vehicle radar data 816 representing the simulated vehicle 804. As discussed above, the simulation system 102 may use various techniques to generate the simulated radar data. In the example shown in box 814, the simulation system 102 may perform ray casting operations in which the multi-region vehicle radar mask 808 is used to determine which rays are reflected by and which rays pass through the simulated vehicle. As shown in this example, filled circles represent radar points generated based on rays reflected by the simulated vehicle 804, and hollow circles represent radar points based on rays that passed through the simulated vehicle 804. In this example, a larger percentage of rays pass through the upper portion of the simulated vehicle 804 corresponding to the second region 812 of the vehicle radar mask 808.

Figure 9:
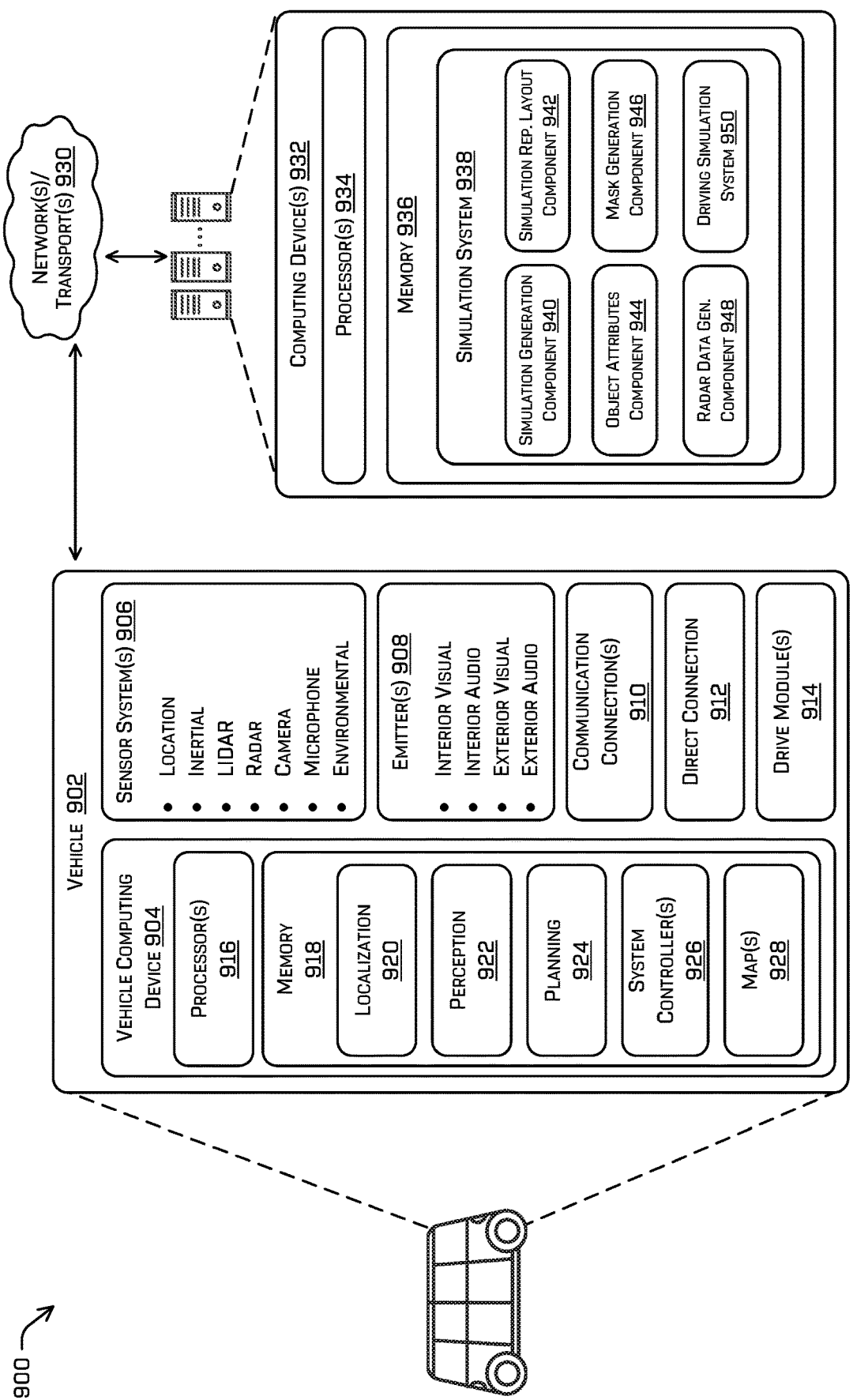
FIG. 9 depicts a block diagram of an example system for implementing various techniques described herein.

FIG. 9 depicts a block diagram of an example system 900 for implementing the techniques described herein. In at least one example, the system 900 can include a vehicle 902, which can be an actual vehicle capable of navigating an environment, or a simulated vehicle instantiated during a driving simulation, as described above with reference to FIGS. 1-8. The system 900 also may include one or more computing devices 932, which can be implemented as a simulation system and/or sensor engine, and may be the same as or similar to the simulation system 102 described above with reference to FIG. 1.

The vehicle 902 may correspond to a physical autonomous vehicle traversing through a physical environments, and/or to a simulated vehicle operating within a virtual and/or log-based simulation. Both for implementations including real vehicles and simulated vehicles, the vehicle 902 may include various software-based and/or hardware-based components of an autonomous vehicle, and may be used to control autonomous vehicles traversing through physical or simulated environments.

The vehicle 902 can be a hardware-based and/or software-based controller for a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In some instances, a vehicle control system may operate within a real associated vehicle, such as a fully or partially autonomous vehicle having any other level or classification. In some instances, the techniques described herein may be usable by non-autonomous vehicles as well. Additionally or alternatively, the vehicle 902 may operate independently from a physical vehicle, for example, as a hardware and software-based controller for a simulated vehicle executing in a computing environment during the development, testing, and validation processes for the vehicle 902. In addition, while implementations of the vehicle 902 described herein may include simulating a control system of an autonomous vehicle, semi-autonomous vehicle, or a non-autonomous vehicle, some of the techniques may be in a simulated environment, using a simulated vehicle.

The vehicle 902 can be used for any configuration of real or simulated vehicles, such as, for example, a van, a sport utility vehicle, a cross-over vehicle, a truck, a bus, an agricultural vehicle, and/or a construction vehicle. For instance, the associated vehicle for the vehicle 902 can be powered by one or more internal combustion engines, one or more electric motors, hydrogen power, any combination thereof, and/or any other suitable power sources. Although the associated vehicle may have four wheels, the vehicle 902 and associated techniques described herein can be incorporated into vehicles having fewer or a greater number of wheels, and/or tires. The vehicle 902 can include systems to control vehicles having four-wheel steering and can operate generally with equal or similar performance characteristics in all directions, for example, such that a first end of the vehicle is the front end of the vehicle when traveling in a first direction, and such that the first end becomes the rear end of the vehicle when traveling in the opposite direction. Similarly, a second end of the vehicle is the front end of the vehicle when traveling in the second direction, and such that the second end becomes the rear end of the vehicle when traveling in the opposite direction. These example characteristics may facilitate greater maneuverability, for example, in small spaces or crowded environments, such as parking lots and/or urban areas.

In some examples, vehicle 902 can include a vehicle computing device 904, one or more sensor systems 906, one or more emitters 908, one or more communication connections 910, at least one direct connection 912, and one or more drive assemblies 914. The vehicle computing device 904 can include one or more processors 916 and memory 918 communicatively coupled with the one or more processors 916. In the illustrated example, the vehicle 902 is an autonomous vehicle; however, the vehicle 902 could be any other type of vehicle, or any other system having one or more sensor systems. In the illustrated example, the memory 918 of the vehicle computing device 904 stores a localization component 920, a perception component 922, a planning component 924, one or more system controllers 926, and one or more maps 928. Though depicted in FIG. 9 as residing in memory 918 for illustrative purposes, it is contemplated that the localization component 920, the perception component 922, the planning component 924, the one or more system controllers 926, and the one or more maps 928 may additionally, or alternatively, be accessible to the vehicle 902 (e.g., stored remotely).

In at least one example, the localization component 920 can include functionality to receive data from the sensor system(s) 906 to determine a position of the vehicle 902. For example, the localization component 920 can include and/or request/receive a map of an environment and can continuously determine a location of the autonomous vehicle within the map. In some instances, the localization component 920 can utilize SLAM (simultaneous localization and mapping) or CLAMS (calibration, localization and mapping, simultaneously) to receive image data, LIDAR data, radar data, IMU data, GPS data, wheel encoder data, and the like to accurately determine a location of the autonomous vehicle. In some instances, the localization component 920 can provide data to various components of the vehicle 902 to determine an initial position of an autonomous vehicle for generating a candidate trajectory, as discussed herein.

In some instances, the perception component 922 can include functionality to perform object detection, segmentation, and/or classification. In some examples, the perception component 922 can provide processed sensor data that indicates a presence of an entity that is proximate to the vehicle 902 and/or a classification of the entity as an entity type (e.g., car, pedestrian, cyclist, animal, building, tree, road surface, curb, sidewalk, unknown, etc.). In additional and/or alternative examples, the perception component 922 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

In general, the planning component 924 can determine a path for the vehicle 902 to follow to traverse through an environment. For example, the planning component 924 can determine various routes and trajectories and various levels of detail. For example, the planning component 924 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 924 can generate an instruction for guiding the autonomous vehicle along at least a portion of the route from the first location to the second location. In at least one example, the planning component 924 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique.

In at least one example, the vehicle computing device 904 can include one or more system controllers 926, which can be configured to control steering, propulsion, braking, safety, emitters, communication, and other systems of the vehicle 902. The system controller(s) 926 can communicate with and/or control corresponding systems of the drive assembly(s) 914 and/or other components of the vehicle 902.

The memory 918 can further include one or more maps 928 that can be used by the vehicle 902 to navigate within the environment. For the purpose of this discussion, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In one example, a map can include a three-dimensional mesh generated using the techniques discussed herein. In some instances, the map can be stored in a tiled format, such that individual tiles of the map represent a discrete portion of an environment, and can be loaded into working memory as needed. In at least one example, the one or more maps 928 may include at least one map (e.g., images and/or a mesh) generated in accordance with the techniques discussed herein. In some examples, the vehicle 902 can be controlled based at least in part on the maps 928. That is, the maps 928 can be used in connection with the localization component 920, the perception component 922, and/or the planning component 924 to determine a location of the vehicle 902, identify objects in an environment, and/or generate routes and/or trajectories to navigate within an environment.

In some examples, the one or more maps 928 may be stored on a remote computing device(s) (such as the computing device(s) 932) accessible via network(s) 930. In some examples, multiple maps 928 may be stored based on, for example, a characteristic (e.g., type of entity, time of day, day of week, season of the year, etc.). Storing multiple maps 928 may have similar memory requirements, but increase the speed at which data in a heat map may be accessed.

In some instances, aspects of some or all of the components discussed herein may include any models, algorithms, and/or machine learning algorithms. For example, in some instances, the components in the memory 918 (and the memory 936, discussed below) may be implemented as a neural network.

As described herein, an exemplary neural network is a biologically inspired algorithm which passes input data through a series of connected layers to produce an output. Each layer in a neural network may also comprise another neural network, or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet70, ResNet101, VGG, DenseNet, PointNet, and the like.

In at least one example, the sensor system(s) 906 can include LIDAR sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 906 can include multiple instances of each of these or other types of sensors. For instance, the LIDAR sensors can include individual LIDAR sensors located at the corners, front, back, sides, and/or top of the vehicle 902. As another example, the camera sensors can include multiple cameras disposed at various locations about the exterior and/or interior of the vehicle 902. The sensor system(s) 906 can provide input to the vehicle computing device 904. Additionally or alternatively, the sensor system(s) 906 can send sensor data, via the one or more networks 930, to the one or more computing device(s) at a particular frequency, after a lapse of a predetermined period of time, in near real-time, etc.

The vehicle 902 can also include one or more emitters 908 for emitting light and/or sound, as described above. The emitters 908 in this example include interior audio and visual emitters to communicate with passengers of the vehicle 902. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 908 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 902 can also include one or more communication connection(s) 910 that enable communication between the vehicle 902 and one or more other local or remote computing device(s). For instance, the communication connection(s) 910 can facilitate communication with other local computing device(s) on the vehicle 902 and/or the drive assembly(s) 914. Also, the communication connection(s) 910 can allow the vehicle to communicate with other nearby computing device(s) (e.g., other nearby vehicles, traffic signals, etc.). The communications connection(s) 910 also enable the vehicle 902 to communicate with a remote teleoperations computing device or other remote services.

The communications connection(s) 910 can include physical and/or logical interfaces for connecting the vehicle computing device 904 to another computing device or a network, such as network(s) 930. For example, the communications connection(s) 910 can enable Wi-Fi-based communication such as via frequencies defined by the IEEE 802.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s).

In at least one example, the vehicle 902 can include one or more drive assemblies 914. In some examples, the vehicle 902 can have a single drive assembly 914. In at least one example, if the vehicle 902 has multiple drive assemblies 914, individual drive assemblies 914 can be positioned on opposite ends of the vehicle 902 (e.g., the front and the rear, etc.). In at least one example, the drive assembly(s) 914 can include one or more sensor systems to detect conditions of the drive assembly(s) 914 and/or the surroundings of the vehicle 902. By way of example and not limitation, the sensor system(s) can include one or more wheel encoders (e.g., rotary encoders) to sense rotation of the wheels of the drive assemblies, inertial sensors (e.g., inertial measurement units, accelerometers, gyroscopes, magnetometers, etc.) to measure orientation and acceleration of the drive assembly, cameras or other image sensors, ultrasonic sensors to acoustically detect objects in the surroundings of the drive assembly, LIDAR sensors, radar sensors, etc. Some sensors, such as the wheel encoders can be unique to the drive assembly(s) 914. In some cases, the sensor system(s) on the drive assembly(s) 914 can overlap or supplement corresponding systems of the vehicle 902 (e.g., sensor system(s) 906).

The drive assembly(s) 914 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive assembly(s) 914 can include a drive assembly controller which can receive and preprocess data from the sensor system(s) and to control operation of the various vehicle systems. In some examples, the drive assembly controller can include one or more processors and memory communicatively coupled with the one or more processors. The memory can store one or more programs or instructions to perform various functionalities of the drive assembly(s) 914. Furthermore, the drive assembly(s) 914 also include one or more communication connection(s) that enable communication by the respective drive assembly with one or more other local or remote computing device(s).

In at least one example, the localization component 920, perception component 922, and/or the planning component 924 can process sensor data, as described above, and can send their respective outputs, over the one or more network(s) 930, to one or more computing device(s) 932. In at least one example, the localization component 920, the perception component 922, and/or the planning component 924 can send their respective outputs to the one or more computing device(s) 932 at a particular frequency, after a lapse of a predetermined period of time, in near real-time, etc.

As described above with reference to FIGS. 1-8, and as discussed throughout this disclosure, the vehicle 902 can send sensor data to one or more computing device(s) 932, via the network(s) 930. In some examples, the vehicle 902 can send raw sensor data to the computing device(s) 932. In other examples, the vehicle 902 can send processed sensor data and/or representations of sensor data to the computing device(s) 932. In some examples, the vehicle 902 can send sensor data to the computing device(s) 932 at a particular frequency, after a lapse of a predetermined period of time, in near real-time, etc. In some cases, the vehicle 902 can send sensor data (raw or processed) to the computing device(s) 932 as one or more log files.

During a driving simulation, the computing device(s) 932 can execute the simulation including the simulated environment and/or simulated agents/objects. The computing device(s) 932 may provide the simulation data to the vehicle 902 in the form of sensor data to be detected and processed by the sensor system(s) 906 of the vehicle. During a simulation, the vehicle 902 may respond to the sensor input provided by the computing device(s) 932, while the simulation environment and agents/object executing on the computing device(s) 932 may detect and respond to the vehicle control commands output by the vehicle 902 (e.g., via the system controller 926) that control the movement and other actions performed by the vehicle 902.

In at least one example, the computing device(s) 932 can include one or more processors 934 and memory 936 communicatively coupled with the one or more processors 934. In the illustrated example, the memory 936 of the computing device(s) 932 stores a simulation system 938, which may be similar or identical to the simulation system 102 described above in reference to FIGS. 1-8. The simulation system 938 includes a simulation generation component 940, a simulation representation layout component 942, an object attributes component 944, a mask generation component 946, a radar data generation component 948, and a driving simulation system 950. The simulation generation component 940, simulation representation layout component 942, object attributes component 944, mask generation component 946, radar data generation component 948, and driving simulation system 950 may be similar or identical to the corresponding components described above in FIG. 2.

The processor(s) 916 of the vehicle 902 and the processor(s) 934 of the computing device(s) 932 can be any suitable processor capable of executing instructions to process data and perform operations as described herein. By way of example and not limitation, the processor(s) 916 and 934 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 918 and memory 936 are examples of non-transitory computer-readable media. Memory 918 and memory 936 can store an operating system and one or more software applications, instructions, programs, and/or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein. It should be noted that while FIG. 9 is illustrated as a distributed system, in alternative examples, components of the vehicle 902 can be associated with the computing device(s) 932 and/or components of the computing device(s) 932 can be associated with the vehicle 902. That is, the vehicle 902 can perform one or more of the functions associated with the computing device(s) 932, and vice versa.

Figure 10:
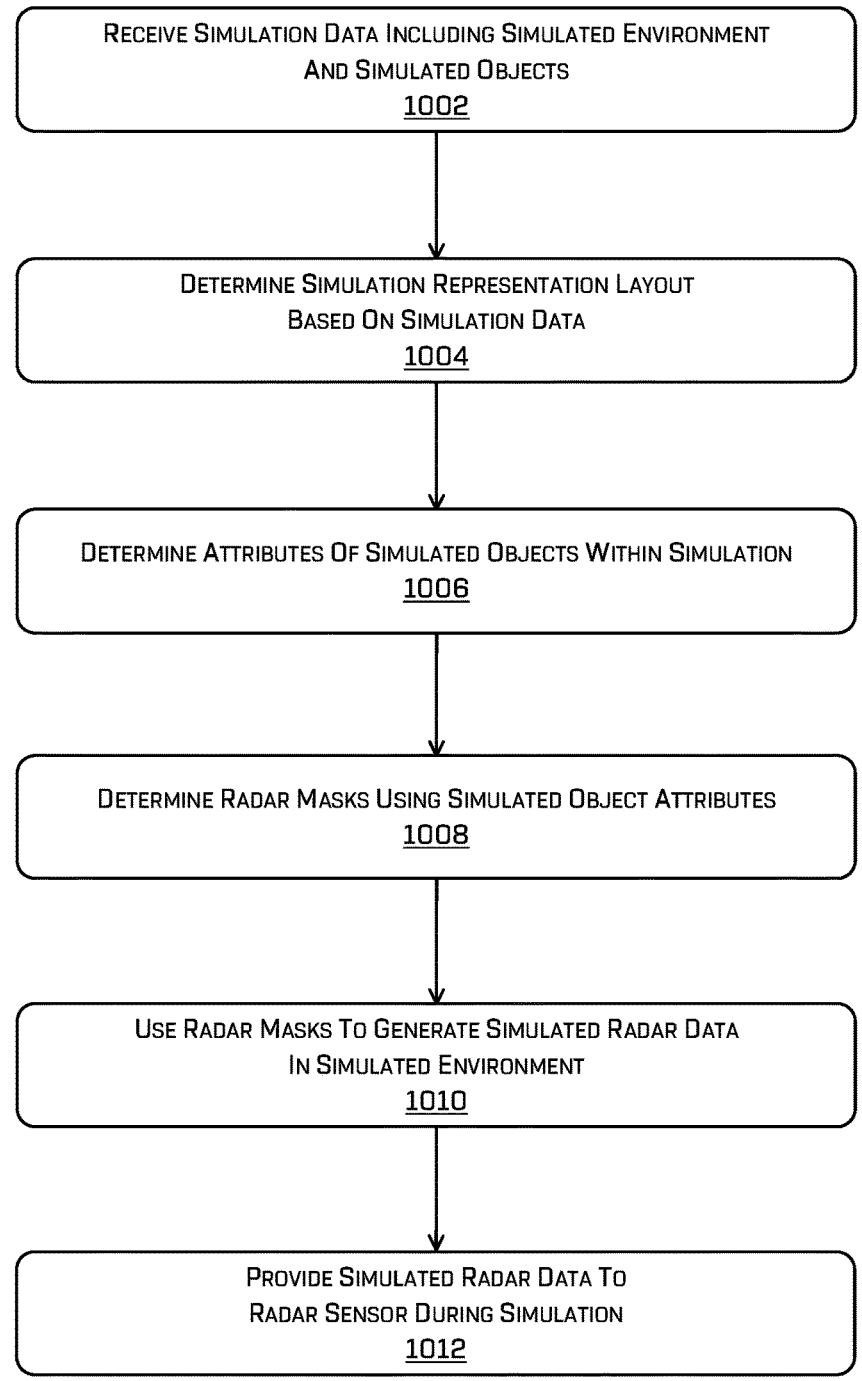
FIG. 10 depicts an example process of generating simulated radar data using radar masks based on simulated object attributes, in accordance with one or more examples of the disclosure.

FIG. 10 depicts an example process 1000 for generating simulated radar data to represent a simulated object in a simulation. In this example, a simulation system 102 may use various combinations of the techniques described herein to determine and apply a radar mask to determine or generate the radar data for a simulated object, based on the attributes of the simulated object. As described below, some or all of the operations described in process 1000 can be performed by components discussed above in FIGS. 1-9, such as simulation system 102 including various subcomponents such as those described above in reference to FIG. 2.

At operation 1002, the simulation system 102 may receive simulation data including data identifying a simulated environment and/or one or more simulated objects. As described above, the simulation data received in operation 1002 may define the simulated environment based on a simulation scenario to be generated, as well as a number of simulated objects to be rendered within the simulation. The simulation data also may include any number of object attributes associated with the various simulated objects, including but not limited to the object classifications, positions, sizes, poses, velocities, surface angles, material compositions, etc. The simulation data received in operation 1002 also may include data defining the type and characteristics of the driving scenario to be simulated (e.g., highway scenarios, 4-way stop scenarios, crosswalk scenarios, etc.) and the driving conditions to be simulated during the simulation (e.g., weather conditions, lighting conditions and ambient temperature, visibility, etc.).

At operation 1004, the simulation system 102 may determine a representation and/or layout associated with the simulation, based on the simulation data received in operation 1002. In some examples, the simulation representation layout component 206 may generate a top-down representation of the simulation scenario, and may evaluate the geometry of the scenario including the positions and orientations of the various simulated objects. The simulation layout/representation may include one or more of a multi-channel top-down representation of the simulation environment, a flat-plane representation of the environment from the perspective of the simulated radar sensors, etc.

At operation 1006, the simulation system 102 may determine one or more attributes associated with the simulated objects in the simulation. The object attributes determined in operation 1006 may correspond to attributes of the simulated object itself, such as, for example, the material properties of the object, the surface angles of the object relative to the simulated sensors, the size of the object, the type/classification of the object, etc. Additional attributes determined in operation 1006 may include one or more attributes associated with the simulated environment, such as the ambient temperature, lighting or visibility conditions, weather conditions (e.g., fog, rain, etc.) that may potentially affect the behavior of any radar signals transmitted within the environment.

At operation 1008, the simulation system 102 may determine one or more radar masks for the simulated objects. As discussed above, radar data masks can define percentages of the radar data generated for a simulated object to be retained or discarded, based on the attributes of and associated with the object. The simulation system 102 may use various techniques, including tables or other heuristics data, algorithms, and/or trained models to determine the radar data mask regions and/or percentages based on the associated object attribute data.

At operation 1010, the simulation system 102 may use the radar masks determined in operation 1008 to generate simulated radar data associated with the simulated objects. In some examples, a radar data generation component 226 may use the radar masks and the simulation layout/representation to generate simulated radar data 228 associated with various simulated objects. For instance, the radar data generation component 226 may use ray tracing techniques to generate synthetic radar data points, during which the radar data generation component 226 may determine intersection points between the rays and the surfaces of various simulated objects. When a ray intersects with a simulated object, the radar data generation component 226 may apply the radar mask associated with the simulated object to determine whether the ray may be reflected by or may pass through the simulated object. When a simulated object acts as an occluding object in the simulation, partially or entirely blocking another simulated object from being perceived by the radar sensors in the simulation, the simulation system 102 may determine the extent to which such objects occlude other simulated objects (e.g., an occlusion percentage) based on the scene geometry of the simulation scenario and the attributes of the individual objects (e.g., sizes, locations, orientation angles, etc.). The object attributes for the simulated objects and/or one or more occluding objects may be used by the simulation system in operation 1002 (e.g., using the heuristics, algorithms, trained models, etc.) to determine the radar data percentages reflected by and/or passing through the various simulated objects. In some cases, the simulation system 102 may multiply or otherwise combine the percentages associated with different object attributes, to determine the overall radar retention percentage for the radar data mask (or multiple percentages for multi-region masks).

At operation 1012, the simulation system 102 may provide the simulated radar data to one or more simulated radar sensors during execution of a driving simulation. As described above, by providing the improved synthetic radar data to the simulated sensors during driving simulations, these techniques may improve testing and validation of the various features and functionalities of the simulated vehicles, which further improves the vehicle safety and efficiency of autonomous vehicles operating in real-world driving environments.

Example Clauses

A. A system comprising: one or more processors; and one or more computer-readable media storing computer-executable instructions that, when executed, cause the one or more processors to perform operations comprising: receiving simulation data representing a first simulated object in a simulation; determining, based at least in part on the simulation data, a first material property associated with the first simulated object; determining, based at least in part on the first material property, a first radar mask associated with the first simulated object; performing a first ray tracing operation to determine simulated radar data associated with the first simulated object, wherein performing the first ray tracing operation comprises: determining a first ray from a location of a simulated radar sensor in the simulation to the first simulated object; determining, based at least in part on the first radar mask, that the first ray is permitted to pass through the first simulated object; and determining a first radar data point associated with the first ray tracing operation, wherein the first radar data point includes data based at least in part on a second simulated object occluded from the simulated radar sensor by the first simulated object; and providing the simulated radar data associated with the first simulated object as input to the simulated radar sensor during the simulation.

B. The system of paragraph A, the operations further comprising: performing a second ray tracing operation, wherein performing the second ray tracing operation comprises: determining a second ray from the location of the simulated radar sensor in the simulation to the first simulated object; determining, based at least in part on the first radar mask, that the second ray is permitted to pass through the first simulated object; determining, based at least in part on a second radar mask associated with the second simulated object, that the second ray is permitted to pass through the second simulated object; and determining a second radar data point associated with the second ray tracing operation, wherein the second radar data point includes data based at least in part on a third simulated object occluded from the simulated radar sensor by the first simulated object and the second simulated object; and providing the second radar data point, as part of the simulated radar data associated with the first simulated object, as input to the simulated radar sensor during the simulation.

C. The system of paragraph A, wherein determining the first radar mask comprises: determining an attribute associated with the first simulated object, wherein the attribute includes at least one of an object classification or a distance between the first simulated object and the simulated radar sensor; and determining a percentage value associated with the first radar mask, based at least in part on the first material property and the attribute.

D. The system of paragraph A, wherein determining the first radar mask comprises: determining a first portion of the first simulated object associated with the first material property; determining a first percentage value associated with the first material property; determining a second portion of the first simulated object associated with a second material property different from the first material property; determining a second percentage value associated with the second material property; and determining the first radar mask based at least in part on the first percentage value and the second percentage value.

E. The system of paragraph D, wherein determining the first radar mask further comprises: determining a first region of the first radar mask corresponding to the first portion of the first simulated object; determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

F. A method comprising: receiving simulation data representing a first simulated object in a simulation; determining, based at least in part on the simulation data, a first attribute associated with the first simulated object; determining, based at least in part on the first attribute, a first radar mask associated with the first simulated object; determining radar data associated with the first simulated object, based at least in part on the first radar mask; and providing the radar data associated with the first simulated object as input to a simulated radar sensor during the simulation.

G. The method of paragraph F, wherein determining the radar data comprises: performing a first ray tracing operation; determining, based at least in part on the first radar mask, that a first ray associated with the first ray tracing operation is permitted to pass through the first simulated object; and determining a first radar data point associated with the first ray tracing operation, wherein the first radar data point includes data based at least in part on a second simulated object occluded from the simulated radar sensor by the first simulated object.

H. The method of paragraph G, wherein determining the radar data further comprises: performing a second ray tracing operation; determining, based at least in part on the first radar mask, that a second ray associated with the second ray tracing operation is permitted to pass through the first simulated object; determining, based at least in part on a second radar mask associated with the second simulated object, that the second ray is permitted to pass through the second simulated object; and determining a second radar data point associated with the second ray tracing operation, wherein the second radar data point includes data based at least in part on a third simulated object occluded from the simulated radar sensor by the second simulated object.

I. The method of paragraph F, wherein the first attribute includes a material property associated with the first simulated object, and wherein determining the first radar mask comprises: determining a percentage value associated with the material property; and determining the first radar mask based at least in part on the percentage value.

J. The method of paragraph I, wherein determining the first radar mask further comprises: determining a second attribute associated with the first simulated object, wherein the second attribute includes at least one of an object classification or a distance between the first simulated object and the simulated radar sensor; and modifying the percentage value based at least in part on the second attribute.

K. The method of paragraph F, wherein determining the first radar mask comprises: determining a first portion of the first simulated object associated with the first attribute, wherein the first attribute includes a first material property; determining a first percentage value based at least in part on the first attribute; determining a second portion of the first simulated object associated with a second attribute, wherein the second attribute includes a second material property different from the first material property; determining a second percentage value based at least in part on the second attribute; and determining the first radar mask based at least in part on the first percentage value and the second percentage value.

L. The method of paragraph K, wherein determining the first radar mask further comprises: determining a first region of the first radar mask corresponding to the first portion of the first simulated object; determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

M. The method of paragraph F, wherein determining the radar data comprises associated with the first simulated object comprises: determining, based at least in part on the simulation data, initial radar data associated with the first simulated object, wherein the initial radar data includes a plurality of radar data points; and determining, as the radar data, modified radar data by applying the first radar mask to the initial radar data associated with the first simulated object, wherein the modified radar data includes a subset of the plurality of radar data points.

N. One or more non transitory computer readable media storing instructions executable by a processor, wherein the instructions, when executed, cause the processor to perform operations comprising: receiving simulation data representing a first simulated object in a simulation; determining, based at least in part on the simulation data, a first attribute associated with the first simulated object; determining, based at least in part on the first attribute, a first radar mask associated with the first simulated object; determining radar data associated with the first simulated object, based at least in part on the first radar mask; and providing the radar data associated with the first simulated object as input to a simulated radar sensor during the simulation.

O. The one or more non transitory computer readable media of paragraph N, wherein determining the radar data comprises: performing a first ray tracing operation; determining, based at least in part on the first radar mask, that a first ray associated with the first ray tracing operation is permitted to pass through the first simulated object; and determining a first radar data point associated with the first ray tracing operation, wherein the first radar data point includes data based at least in part on a second simulated object occluded from the simulated radar sensor by the first simulated object.

P. The one or more non transitory computer readable media of paragraph O, wherein determining the radar data further comprises: performing a second ray tracing operation; determining, based at least in part on the first radar mask, that a second ray associated with the second ray tracing operation is permitted to pass through the first simulated object; determining, based at least in part on a second radar mask associated with the second simulated object, that the second ray is permitted to pass through the second simulated object; and determining a second radar data point associated with the second ray tracing operation, wherein the second radar data point includes data based at least in part on a third simulated object occluded from the simulated radar sensor by the second simulated object.

Q. The one or more non transitory computer readable media of paragraph N, wherein the first attribute includes a material property associated with the first simulated object, and wherein determining the first radar mask comprises: determining a percentage value associated with the material property; and determining the first radar mask based at least in part on the percentage value.

R. The one or more non transitory computer readable media of paragraph Q, wherein determining the first radar mask further comprises: determining a second attribute associated with the first simulated object, wherein the second attribute includes at least one of an object classification or a distance between the first simulated object and the simulated radar sensor; and modifying the percentage value based at least in part on the second attribute.

S. The one or more non transitory computer readable media of paragraph N, wherein determining the first radar mask comprises: determining a first portion of the first simulated object associated with the first attribute, wherein the first attribute includes a first material property; determining a first percentage value based at least in part on the first attribute; determining a second portion of the first simulated object associated with a second attribute, wherein the second attribute includes a second material property different from the first material property; determining a second percentage value based at least in part on the second attribute; and determining the first radar mask based at least in part on the first percentage value and the second percentage value.

T. The one or more non transitory computer readable media of paragraph S, wherein determining the first radar mask further comprises: determining a first region of the first radar mask corresponding to the first portion of the first simulated object; determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

While the example clauses described above are described with respect to particular implementations, it should be understood that, in the context of this document, the content of the example clauses can be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing blocks, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
   one or more processors; and
   one or more computer-readable media storing computer-executable instructions that, when executed, cause the one or more processors to perform operations comprising:
      receiving simulation data representing a first simulated object in a simulation;
      determining, based at least in part on the simulation data, a first material property associated with the first simulated object;
      determining, based at least in part on the first material property, a first radar mask associated with the first simulated object;
      performing a first ray tracing operation to determine simulated radar data associated with the first simulated object, wherein performing the first ray tracing operation comprises:
         determining a first ray from a location of a simulated radar sensor in the simulation to the first simulated object;
         determining, based at least in part on the first radar mask, that the first ray is permitted to pass through the first simulated object; and
         determining a first radar data point associated with the first ray tracing operation, wherein the first radar data point includes data based at least in part on a second simulated object occluded from the simulated radar sensor by the first simulated object; and
      providing the simulated radar data associated with the first simulated object as input to the simulated radar sensor during the simulation.

2. The system of claim 1, the operations further comprising:
   performing a second ray tracing operation, wherein performing the second ray tracing operation comprises:
      determining a second ray from the location of the simulated radar sensor in the simulation to the first simulated object;
      determining, based at least in part on the first radar mask, that the second ray is permitted to pass through the first simulated object;
      determining, based at least in part on a second radar mask associated with the second simulated object, that the second ray is permitted to pass through the second simulated object; and
      determining a second radar data point associated with the second ray tracing operation, wherein the second radar data point includes data based at least in part on a third simulated object occluded from the simulated radar sensor by the first simulated object and the second simulated object; and
   providing the second radar data point, as part of the simulated radar data associated with the first simulated object, as input to the simulated radar sensor during the simulation.

3. The system of claim 1, wherein determining the first radar mask comprises:
   determining an attribute associated with the first simulated object, wherein the attribute includes at least one of an object classification or a distance between the first simulated object and the simulated radar sensor; and
   determining a percentage value associated with the first radar mask, based at least in part on the first material property and the attribute.

4. The system of claim 1, wherein determining the first radar mask comprises:
   determining a first portion of the first simulated object associated with the first material property;
   determining a first percentage value associated with the first material property;
   determining a second portion of the first simulated object associated with a second material property different from the first material property;
   determining a second percentage value associated with the second material property; and
   determining the first radar mask based at least in part on the first percentage value and the second percentage value.

5. The system of claim 4, wherein determining the first radar mask further comprises:
   determining a first region of the first radar mask corresponding to the first portion of the first simulated object;

determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

6. One or more non-transitory computer-readable media storing instructions executable by a processor, wherein the instructions, when executed, cause the processor to perform operations comprising:

receiving simulation data representing a first simulated object in a simulation;

determining, based at least in part on the simulation data, a first attribute associated with the first simulated object;

determining, based at least in part on the first attribute, a first radar mask associated with the first simulated object;

determining radar data associated with the first simulated object, based at least in part on the first radar mask, wherein determining the radar data comprises:

performing a first ray tracing operation;

determining, based at least in part on the first radar mask, that a first ray associated with the first ray tracing operation is permitted to pass through the first simulated object; and determining a first radar data point associated with the first ray tracing operation, wherein the first radar data point includes data based at least in part on a second simulated object occluded from a simulated radar sensor by the first simulated object; and providing the radar data associated with the first simulated object as input to the simulated radar sensor during the simulation.

7. A method comprising:

receiving simulation data representing a first simulated object in a simulation;

determining, based at least in part on the simulation data, a first attribute associated with the first simulated object;

determining, based at least in part on the first attribute, a first radar mask associated with the first simulated object, wherein determining the first radar mask comprises:

determining a first portion of the first simulated object associated with the first attribute, wherein the first attribute includes a first material property;

determining a first percentage value based at least in part on the first attribute;

determining a second portion of the first simulated object associated with a second attribute, wherein the second attribute includes a second material property different from the first material property;

determining a second percentage value based at least in part on the second attribute; and determining the first radar mask based at least in part on the first percentage value and the second percentage value;

determining radar data associated with the first simulated object, based at least in part on the first radar mask; and providing the radar data associated with the first simulated object as input to a simulated radar sensor during the simulation.

8. The method of claim 7, wherein determining the radar data comprises:

performing a first ray tracing operation;

determining, based at least in part on the first radar mask, that a first ray associated with the first ray tracing operation is permitted to pass through the first simulated object; and determining a first radar data point associated with the first ray tracing operation, wherein the first radar data point includes data based at least in part on a second simulated object occluded from the simulated radar sensor by the first simulated object.

9. The method of claim 8, wherein determining the radar data further comprises:

performing a second ray tracing operation;

determining, based at least in part on the first radar mask, that a second ray associated with the second ray tracing operation is permitted to pass through the first simulated object;

determining, based at least in part on a second radar mask associated with the second simulated object, that the second ray is permitted to pass through the second simulated object; and determining a second radar data point associated with the second ray tracing operation, wherein the second radar data point includes data based at least in part on a third simulated object occluded from the simulated radar sensor by the second simulated object.

10. The method of claim 7, wherein determining the first radar mask further comprises:

determining a second attribute associated with the first simulated object, wherein the second attribute includes at least one of an object classification or a distance between the first simulated object and the simulated radar sensor; and modifying the first percentage value based at least in part on the second attribute.

11. The method of claim 7, wherein determining the first radar mask further comprises:

determining a first region of the first radar mask corresponding to the first portion of the first simulated object;

determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

12. The method of claim 7, wherein determining the radar data associated with the first simulated object comprises:

determining, based at least in part on the simulation data, initial radar data associated with the first simulated object, wherein the initial radar data includes a plurality of radar data points; and determining, as the radar data, modified radar data by applying the first radar mask to the initial radar data associated with the first simulated object, wherein the modified radar data includes a subset of the plurality of radar data points.

13. The one or more non-transitory computer-readable media of claim 6, wherein determining the radar data further comprises:

performing a second ray tracing operation;

determining, based at least in part on the first radar mask, that a second ray associated with the second ray tracing operation is permitted to pass through the first simulated object;

determining, based at least in part on a second radar mask associated with the second simulated object, that the second ray is permitted to pass through the second simulated object; and determining a second radar data point associated with the second ray tracing operation, wherein the second radar data point includes data based at least in part on a third simulated object occluded from the simulated radar sensor by the second simulated object.

14. The one or more non-transitory computer-readable media of claim 6, wherein the first attribute includes a material property associated with the first simulated object, and wherein determining the first radar mask comprises:

determining a percentage value associated with the material property; and determining the first radar mask based at least in part on the percentage value.

15. The one or more non-transitory computer-readable media of claim 14, wherein determining the first radar mask further comprises:

determining a second attribute associated with the first simulated object, wherein the second attribute includes at least one of an object classification or a distance between the first simulated object and the simulated radar sensor; and modifying the percentage value based at least in part on the second attribute.

16. The one or more non-transitory computer-readable media of claim 6, wherein determining the first radar mask comprises:

determining a first portion of the first simulated object associated with the first attribute, wherein the first attribute includes a first material property;

determining a first percentage value based at least in part on the first attribute;

determining a second portion of the first simulated object associated with a second attribute, wherein the second attribute includes a second material property different from the first material property;

determining a second percentage value based at least in part on the second attribute; and determining the first radar mask based at least in part on the first percentage value and the second percentage value.

17. The one or more non-transitory computer-readable media of claim 16, wherein determining the first radar mask further comprises:

determining a first region of the first radar mask corresponding to the first portion of the first simulated object;

determining a second region of the first radar mask corresponding to the second portion of the first simulated object; and constructing, as the first radar mask, a mask configured to provide a first percentage of simulated radar data based on the first percentage value within the first region, and a second percentage of simulated radar data based on the second percentage value within the second region.

* * * * *